(12) United States Patent
Schroeder et al.

(10) Patent No.: US 11,538,949 B2
(45) Date of Patent: *Dec. 27, 2022

(54) SENSOR COMPRISING A PHOTOVOLTAIC DEVICE

(71) Applicants: Mark R. Schroeder, Hollister, CA (US); Kenneth Buciak, Morgan Hill, CA (US)

(72) Inventors: Mark R. Schroeder, Hollister, CA (US); Kenneth Buciak, Morgan Hill, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/129,873

(22) Filed: Dec. 21, 2020

(65) Prior Publication Data

US 2021/0217910 A1     Jul. 15, 2021

Related U.S. Application Data

(63) Continuation-in-part of application No. 14/170,007, filed on Jan. 31, 2014, now Pat. No. 10,872,988.

(60) Provisional application No. 61/760,127, filed on Feb. 3, 2013.

(51) Int. Cl.
  *H01L 31/0352* (2006.01)
  *H01L 31/0224* (2006.01)
  *H01L 31/0445* (2014.01)

(52) U.S. Cl.
  CPC ......... *H01L 31/03529* (2013.01); *H01L 31/022466* (2013.01); *H01L 31/0445* (2014.12)

(58) Field of Classification Search
  CPC ......... H01L 31/03529; H01L 31/0445; H01L 31/022466; H01L 31/035281; H01L 31/028; H01L 31/042; H01L 31/0543; H01L 31/0547; H01L 31/02168; H01L 31/02363; H01L 31/056; H01L 31/035227
  USPC .................................................. 136/244–265
  See application file for complete search history.

(56) References Cited

U.S. PATENT DOCUMENTS

| | | | |
|---|---|---|---|
| 5,466,301 A * | 11/1995 | Hammerbacher | H01L 31/035281 136/246 |
| 6,420,644 B1 * | 7/2002 | Fukui | H01L 31/03529 136/244 |
| 6,528,717 B2 * | 3/2003 | Asai | H01L 31/035281 136/244 |
| 6,620,996 B2 | 9/2003 | Sugawara | |
| 6,689,949 B2 | 2/2004 | Ortabasi | |

(Continued)

FOREIGN PATENT DOCUMENTS

| | | | |
|---|---|---|---|
| EP | 1223624 A2 | 7/2002 | |
| WO | WO-2012037379 A2 * | 3/2012 | ....... H01L 31/02363 |
| WO | 2013067427 A1 | 5/2013 | |

OTHER PUBLICATIONS

Spinelli et al, Plasmonic light trapping in thin-film Si solar cells, 2012, J. Opt 14 024002. (Year: 2012).*

(Continued)

*Primary Examiner* — Andrew J Golden
(74) *Attorney, Agent, or Firm* — Cool Patent LLC

(57) ABSTRACT

In one example, a sensor comprises a photovoltaic device. The photovoltaic device comprises a core having a shape that is at least partially spherical, an absorber disposed over the core, and a transparent conductor disposed over the absorber. Other examples and related methods are also disclosed herein.

12 Claims, 26 Drawing Sheets

(56) References Cited

U.S. PATENT DOCUMENTS

| | | | |
|---|---|---|---|
| 6,706,959 B2* | 3/2004 | Hamakawa | H01L 31/035281 |
| | | | 136/250 |
| 6,762,359 B2 | 7/2004 | Asai | |
| 7,208,674 B2 | 4/2007 | Aylian | |
| 7,378,757 B2* | 5/2008 | Nakata | H02J 3/466 |
| | | | 307/71 |
| 7,595,543 B2 | 9/2009 | Weber | |
| 7,619,159 B1 | 11/2009 | Ortabasi | |
| 7,682,544 B2 | 3/2010 | Asai | |
| 7,828,983 B2 | 11/2010 | Weber | |
| 7,875,794 B2 | 1/2011 | Weber | |
| 7,968,790 B2 | 6/2011 | Raymond | |
| 7,968,792 B2 | 6/2011 | Harkness, IV | |
| 8,063,299 B2 | 11/2011 | Haga | |
| 8,153,888 B2 | 4/2012 | Smith | |
| 9,076,908 B2 | 7/2015 | Schroeder | |
| 9,082,911 B2 | 7/2015 | Schroeder | |
| 9,202,964 B2 | 12/2015 | Evelsizer | |
| 9,947,817 B2 | 4/2018 | Smith | |
| 9,954,126 B2 | 4/2018 | Smith | |
| 10,872,988 B1* | 12/2020 | Schroeder | H01L 31/035281 |
| 2002/0162585 A1* | 11/2002 | Sugawara | H01L 31/0547 |
| | | | 136/250 |
| 2008/0271773 A1 | 11/2008 | Jacobs | |
| 2009/0014056 A1* | 1/2009 | Hockaday | H01L 31/0543 |
| | | | 136/247 |
| 2009/0133738 A1 | 5/2009 | Shiao | |
| 2009/0133739 A1 | 5/2009 | Shiao | |
| 2009/0194160 A1* | 8/2009 | Chin | H01L 31/035281 |
| | | | 136/256 |
| 2010/0000599 A1 | 1/2010 | Greulich-Weber | |
| 2010/0078055 A1 | 4/2010 | Vidu | |
| 2010/0180928 A1 | 7/2010 | Raymond | |
| 2010/0269895 A1 | 10/2010 | Smith | |
| 2011/0030761 A1 | 2/2011 | Kalkanoglu | |
| 2011/0095389 A1* | 4/2011 | Cui | H01L 31/02363 |
| | | | 257/432 |
| 2011/0186119 A1* | 8/2011 | Atwater | H01L 31/056 |
| | | | 136/256 |
| 2012/0028007 A1* | 2/2012 | Kildishev | H01L 31/0543 |
| | | | 428/212 |
| 2013/0112236 A1* | 5/2013 | Bhan | H01L 31/03529 |
| | | | 136/246 |
| 2013/0112243 A1* | 5/2013 | Bhan | H01L 31/035281 |
| | | | 136/247 |
| 2014/0209155 A1 | 7/2014 | Schroeder | |
| 2014/0209160 A1* | 7/2014 | Schroeder | H01L 31/035281 |
| | | | 136/256 |
| 2014/0261612 A1* | 9/2014 | Smith | H01L 31/035281 |
| | | | 136/244 |
| 2014/0261648 A1 | 9/2014 | Smith | |
| 2014/0264998 A1 | 9/2014 | Smith | |
| 2016/0172514 A1 | 6/2016 | Smith | |

OTHER PUBLICATIONS

K. Belaroui, Nanocrystalline Coating by Electrophoretic Deposition (EPD), Key Engineering Materials, Dec. 15, 2001, pp. 519-522, 2002 Trans Tech Publications, Switzerland.

Brendan M. Kayes, Comparison of the device physics principles of planar and radial p-n junction nanorod solar cells, May 23, 2005, J. Appl. Phys., 97, 114302 (2005), AIP Publishing, Washington, D.C., US.

Acept W3 Group, Patterns in Nature: Light and Optics, "The Photoelectric effect" pp. 1-3, (Year: 2000), Department of Physics and Astronomy, Arizona State University, Tempe, Arizona, US.

* cited by examiner

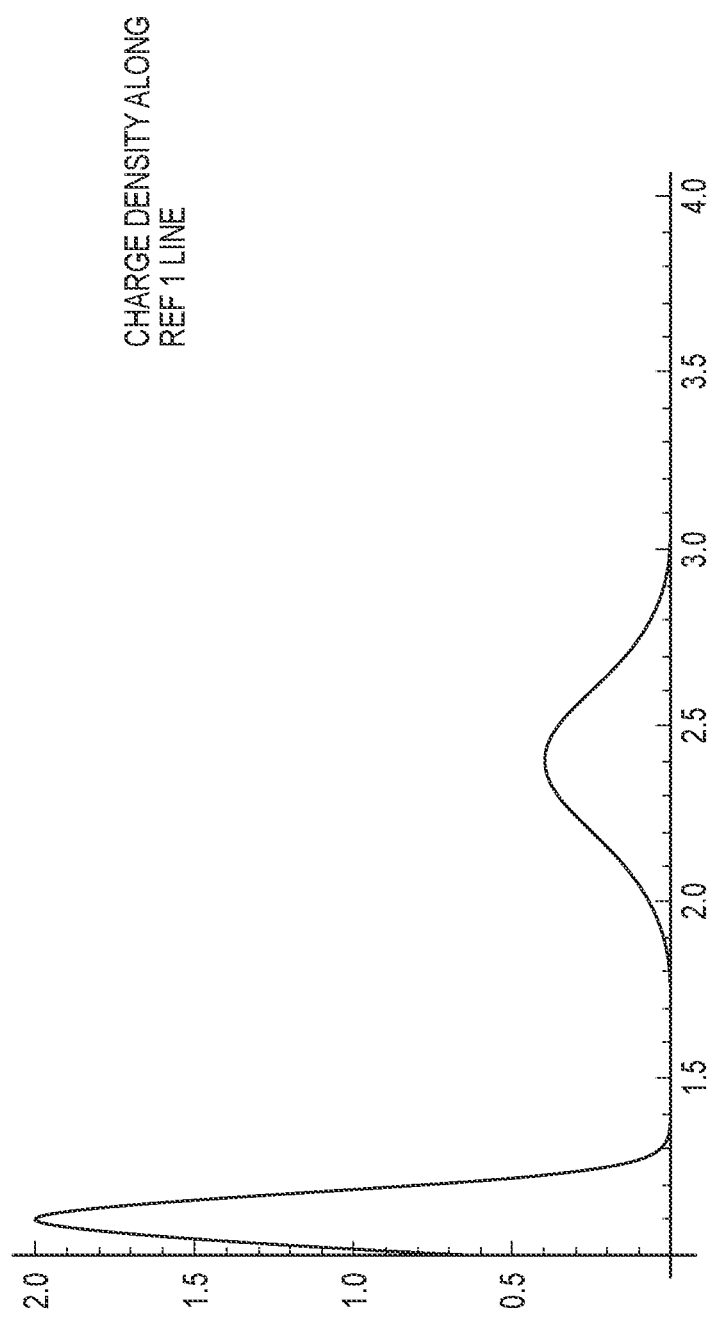

SENSOR COMPRISING A PHOTOVOLTAIC DEVICE

CROSS-REFERENCE TO RELATED APPLICATIONS

The present application is a continuation-in-part of U.S. application Ser. No. 14/170,007 filed Jan. 31, 2014 which in turn claims the benefit of U.S. Provisional Application No. 61/760,127 filed Feb. 3, 2013. Said Application No. 61/760,127 and said application Ser. No. 14/170,007 are hereby incorporated by reference herein in their entireties.

BACKGROUND

Photovoltaic devices are typically used in solar panels having a planar structure. The power output of a planar device, however, decreases increasingly oblique angles of the incident light rays. As a result, solar panels having planar photovoltaic devices may not be deployed at higher latitudes since the decreased power output may not justify the expense of the solar panel. In addition, the amount of power generated over a day from sunrise to sunset may not be sufficient to justify the expense of the solar panel system due to decreased power output in the early morning or late evening. Solar trackers could be used to direct the planar device solar panel to track the movement of the sun over the course of a day, and to compensate for altitude and seasonal angle changes of the sun, but such solar trackers may be too complex and cost prohibitive for widespread deployment. Furthermore, planar photovoltaic devices have had generally limited efficiencies which also has impeded wide scale deployment of solar panel systems.

DESCRIPTION OF THE DRAWING FIGURES

Claimed subject matter is particularly pointed out and distinctly claimed in the concluding portion of the specification. Such subject, however, matter may be understood by reference to the following detailed description when read with the accompanying drawings.

FIG. 13, FIG. 14, FIG. 15, FIG. 16 and FIG. 17 are graphs and illustrations of charge density in an example pleniron in accordance with one or more embodiments.

Figure 1:
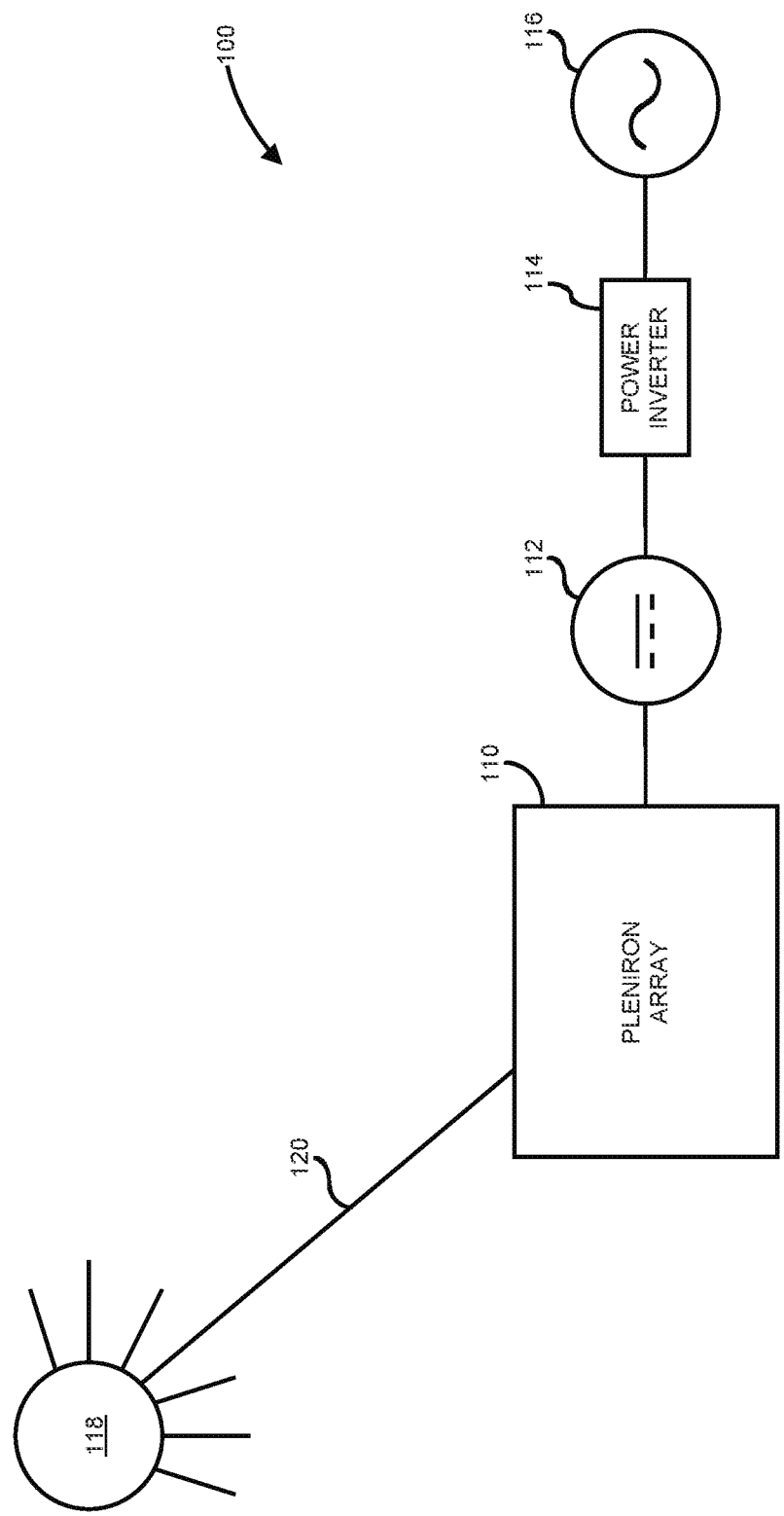
FIG. 1 is diagram of a solar power system comprising an array of photovoltaic devices referred to as a pleniron in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a diagram of a solar power system comprising an array of photovoltaic devices referred to as a pleniron in accordance with one or more embodiments will be discussed. In FIG. 1, an example solar power system 100 may comprise an array 110 of photovoltaic devices, referred to herein as a "pleniron". A pleniron may refer to a photovoltaic device having a general spherical or spheroidal shape or structure, wholly or in part, that is capable of generating electrical power in response to photo energy impinging thereon. pleniron photovoltaic devices with particular structures and properties are shown in and described herein with particular detail as discussed, below. A pleniron array 110 may comprise one or more pleniron photovoltaic devices arranged in a regular or irregular pattern to receive incident light rays 120 from a light source, typically the sun 118, to generate electrical power. Deployed as part of solar power system 100, pleniron array 110 may generate direct current (dc) power 112 that optionally may be converted to alternating current (ac) power 116 via a power inverter 114, although the scope of the claimed subject matter is not limited in this respect. A first example of a pleniron photovoltaic device is shown in and described with respect to FIG. 2, below.

Figure 2:
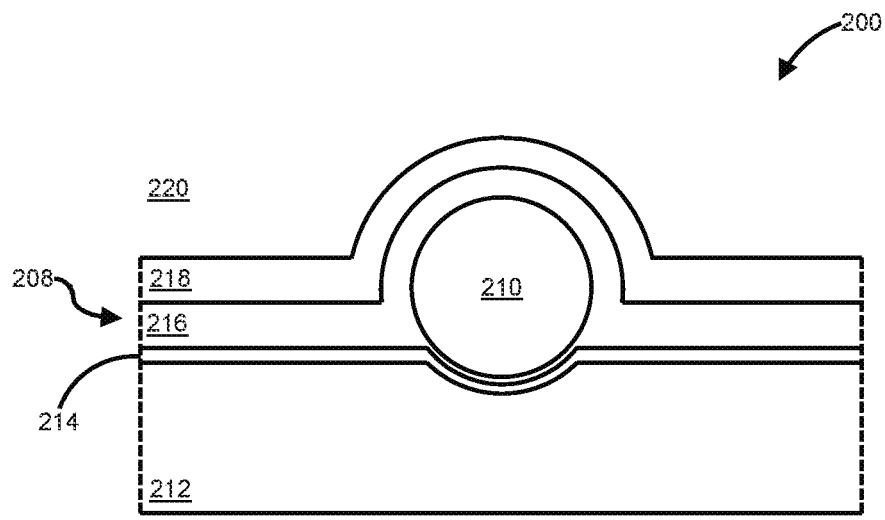
FIG. 2 is a diagram of a pleniron photovoltaic device in accordance with one or more embodiments.

Referring now to FIG. 2, a diagram of a pleniron photovoltaic device in accordance with one or more embodiments will be discussed. As shown in FIG. 2, one example of a pleniron 200 may comprise a pleniron core 210 formed on or in a substrate 212 which typically may comprise a semiconductor material such as silicon Gallium Arsenide, Cadmium Telluride, polycrystalline silicon, or the like. The pleniron core 210 may comprise a generally spherical or spheroidal structure, wholly or in part and may comprise monocrystalline silicon in one or more embodiments. A photovoltaic semiconductor layer 216 may be disposed on substrate 212 and at least partially surrounding pleniron core 210 as shown to function as an absorber 208. Semiconductor layer 216 may comprise an N doped or P doped semiconductor such as silicon. A transparent conductive oxide (TCO) layer 218 may be formed on semiconductor layer 216 in order to provide properties of optical transparence and electrical conductivity. Example materials for TCO layer 218 may include Aluminum doped zinc oxide (AZnO), tin doped zinc oxide (SnZnO), boron doped zinc oxide (BZnO), indium tin oxide (ITO), and so on, and the scope of the claimed subject matter is not limited in this respect.

In one or more embodiments, as shown in FIG. 1, a back contact layer 214 may be disposed between the semiconductor layer 216 and the substrate 212 wherein the back contact layer 214 may comprise an optically transparent conductor such as a transparent conductive oxide (TCO) similar to the TCO layer 218. The material external to TCO layer 220 may comprise an encapsulant 220 for example air where TCO layer 218 is the outermost layer of pleniron 200, or alternatively a transparent or low index coating or filler, and the scope of the claimed subject matter is not limited in these respects. Details of the operation of pleniron 200 will be discussed in further detail from FIG. 6 onward, below.

In one or more embodiments, a pleniron 200 is a unit cell of an overall photovoltaic or photoactive or photo-generative device that, although not exactly identical, is generally congruent with other plenirons 200 in the device. A plenistell may refer to the overall device composed of multiple plenirons 200 and may comprise an array 110 of plenirons 200 in three dimensions that are randomly or regularly spaced. If regularly spaced, Cartesian, polar, or spherical coordinates may be used to describe the pleniron 200 unit cell Basis vector set to define an array or lattice.

A pleniron core 210, in one or more embodiments may be a semiconductor material, of either N or P type (or intrinsic), or a degenerate semiconductor, or a conductive metallic material, that is physically shaped to optimize optical and electronic performance of the overall device. Typical semiconductor materials might be crystalline silicon (c-Si), polysilicon (p-Si), nanocrystalline silicon (nc-Si), Cadmium Telluride (CdTe), Cadmium Sulfide (CdS), Gallium Arsenide (GaAs), Silicon Carbide (SiC), Gallium Nitride (GaN), or any other semiconducting material. A pleniron core 210 in other embodiments may be a semi-pseudo spherical smoothed granular piece of degenerate semiconductor or metallic material, of the correct proportions to the material system as discussed herein that, when layered with the correct proportions of thin film semiconductors and a transparent conductor, will exhibit the optical volume phenomena outlined in other sections of this document. Such other embodiments may also involve the use of any type of back-substrate structuring, such as nano-imprinting or micro-imprinting in polymers or otherwise, followed by plating, radio-frequency (RF) or direct-current (dc) sputtering or chemical vapor deposition (CVD) applied conductors to obtain a 3D pseudo spherical array surface. Layering of the correct proportions of semiconductors on this background, along with a transparent conductor, will allow the appropriate optical volume to occur.

In one or more embodiments, a pleniron 200 may have a shape in physical 3-D space, with surface peaks and valleys less than $\frac{1}{10}$ of the wavelength of light of interest dependent on material energy band gap, to avoid random roughness that will scatter incident photons. In general, the pleniron 200 surfaces including various layers and core 210 may be smooth and curved in definable proportions to the core 210. The curvature may vary over distances comparable to an upper limit of about 25% of the diameter, although the scope of the claimed subject matter is not limited in these respects.

A pleniron core 210 and the layers of the pleniron 200 may have varying curvatures with the underlying purpose of lensing light into the inner core 210. The proportions of layer thicknesses in relation to the inner core will maintain a ratio critical to maximizing Total Internal Reflection (TIR) in the inner core absorber material only. It is not as desirable to obtain TIR in outer layers, but to minimize the number of passes of incident photons through the outer layers, preferably to only one, and maximize the passes on the interior of the absorbing core.

In one or more embodiments, the general shape of the pleniron 200, if it meets the above parameters, in conjunction with other electronic parameters discussed herein, may be described as any of the following: roughly spherical, ovoidal, multi-lobed ovoidal, elliptical, lobed elliptical, dipolar modal, multi-polar modal, and so on. Radial variations could, dependent on the average radius, be up to about 20-25% of the average.

In one or more embodiments, the size of the pleniron, as described above, may be determined by the average size dimension of the core 210, and the proportionality of thicknesses of the upper/outer layers. The core size is largely determined by electronic aspect factors, such as material system (semiconductor N and P type) and the doping level. In addition, the core size may determine the thicknesses of the films deposited on top of the cores, due to the proportionality considerations to be detailed in the following document. These proportionality considerations come out of optics, the lensing and guiding of light in the appropriate spectrum of interest, for example visible and infrared (IR) light, such that an incident photon plane wave may be virtually 100% concentrated, retained, and guided into absorber material over a virtual optical thickness of the device.

In one or more embodiments, from an optical standpoint, for transmission into the pleniron core 210, or layers above a conductive or degenerate semiconductor pleniron core 210, it is possible to obtain an increase in the number of wave modes and their corresponding amplitude (density of photon states), and to encapsulate the pleniron devices in an optically dense material, such as glass. Although refracted rays may be more toward normal incidence for all incidence air-angles, the transmission probabilities of incident rays may be increased across all incident angles such that trapping may be easier to achieve with larger geometries. This is also detailed as a result of a fundamental equation, Equation 1 listed below, by changing the incident medium index of refraction to a value commensurate with the encapsulation material. The angles or incidence on the pleniron device, and therefore the plenistell array 110 as a whole, are altered by the Snell's law incidence of the solar radiation at the interface between the encapsulant and the air.

In accordance with the foregoing, pleniron 200 photovoltaic device may allow the use of reverse construction of the device such that the encapsulant itself may be patterned, whether it be glass or transparent polymer or otherwise, and the semiconductor materials, and subsequent transparent conductor, may be deposited after into the absences afforded by the patterning. With pseudo-sphere or multi-modal pleniron cores 210, this absence patterning are essentially conformally depositing layers of top contact, semiconductor junction, and back contact in a superstrate rather than a substrate configuration. Pleniron 200 construction, therefore, is not limited to a substrate configuration to obtain optical volume phenomena, but may be achieved by a variety of different process methodologies.

Figure 3:
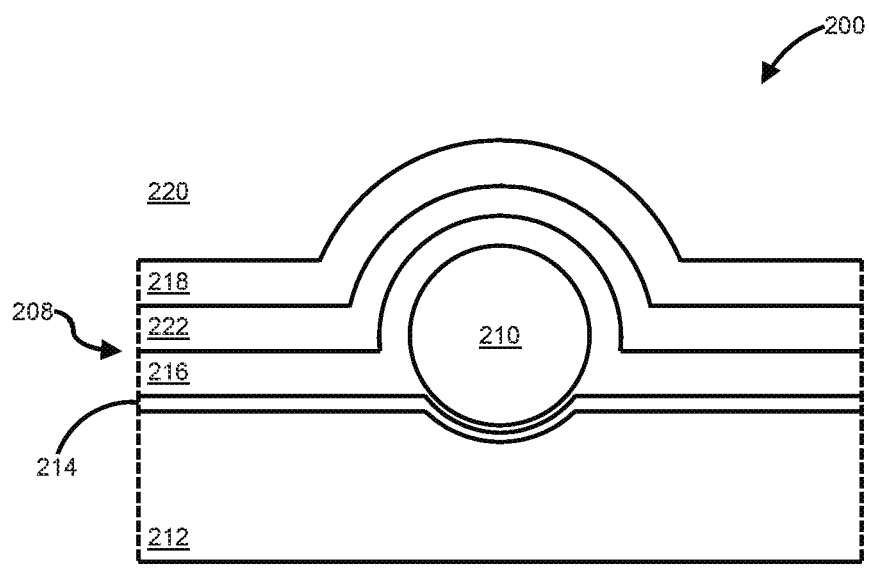
FIG. 3 is a diagram of another pleniron photovoltaic device in accordance with one or more embodiments.

Referring now to FIG. 3, a diagram of another pleniron photovoltaic device in accordance with one or more embodiments will be discussed. pleniron 200 of FIG. 3 is substantially similar to the structure of pleniron 200 of FIG. 2 with the addition in the absorber 208 of semiconductor layer 222 having opposite doping or charge properties with respect to semiconductor layer 216. For example, if semiconductor layer 216 is a P type semiconductor, then semiconductor layer 222 is an N type semiconductor. Alternatively, if semiconductor layer 216 is an N type semiconductor, then semiconductor layer 222 is a P type semiconductor.

Figure 4:
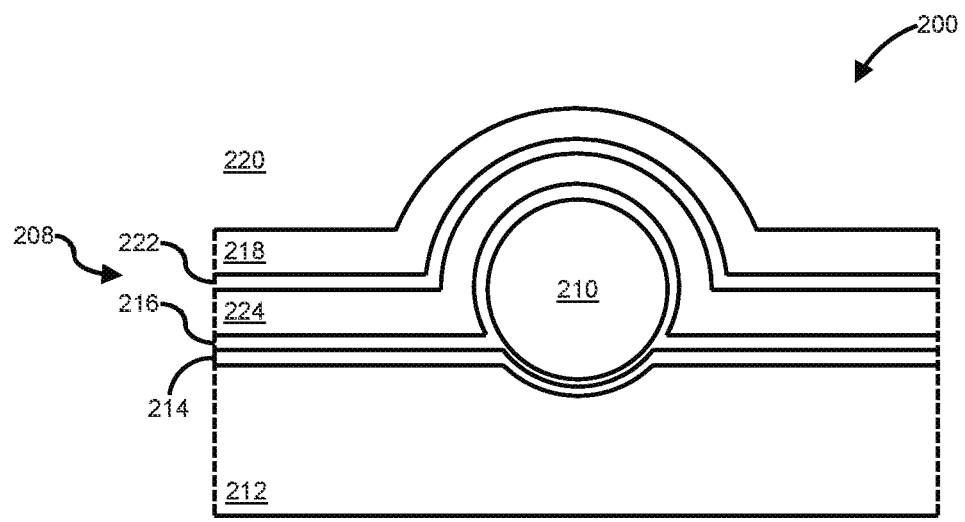
FIG. 4 is a diagram of yet another pleniron photovoltaic device in accordance with one or more embodiments.

Referring now to FIG. 4, a diagram of yet another pleniron photovoltaic device in accordance with one or more embodiments will be discussed. pleniron 200 of FIG. 4 is substantially similar to the structure of pleniron 200 of FIG. 3 with the addition in the absorber 208 of an intrinsic layer 224 disposed between semiconductor layer 216 and semiconductor layer 222. Intrinsic layer 224 may be more lightly doped than either of semiconductor layer 216 and/or semiconductor layer 222. Utilization of intrinsic layer 224 may result in a PIN diode or an NIP diode structure for pleniron 200 suitable for photovoltaic operation, although the scope of the claimed subject matter is not limited in this respect.

Figure 5:
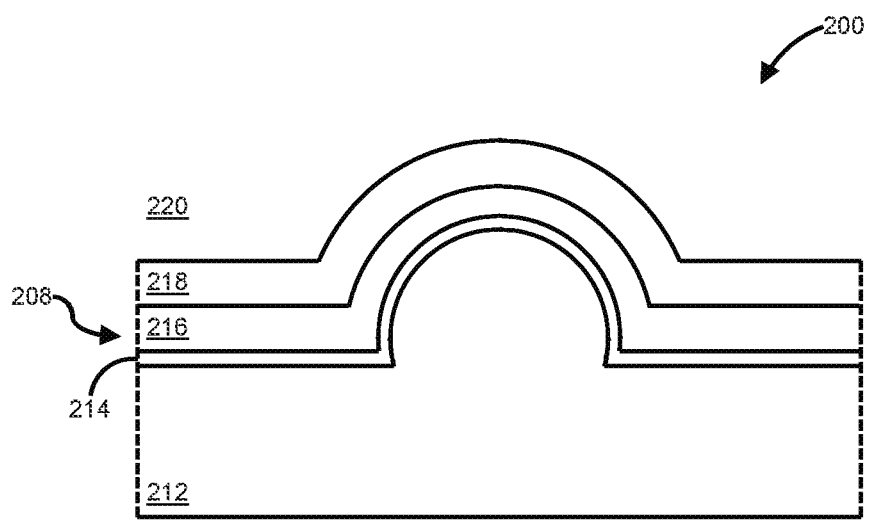
FIG. 5 is a diagram of an alternative pleniron photovoltaic device in accordance with one or more embodiments.

Referring now to FIG. 5, a diagram of an alternative pleniron photovoltaic device in accordance with one or more embodiments will be discussed. pleniron of FIG. 5 is substantially similar to pleniron 200 of FIG. 2 except that instead of having a separate pleniron core 210, a structure 510 having the same or nearly the same function and properties of a pleniron core 210 may be formed using the material of substrate 212 such that structure 510 has a spherical or partially spherical shape, or a spheroidal or partially spheroidal shape as shown. Furthermore, a pleniron 200 as shown in any of FIG. 2, FIG. 3 of FIG. 4, and so on, may be formed with structure 510 to function as a pleniron core 210 rather than utilizing a separate material or structure for pleniron core 210. In general, any shape similar to pleniron core 210 may be formed via any semiconductor manufacturing process to result in the same or similar properties for pleniron 200, for example spheres, domes, bumps, bubbles, and so on, and the scope of the claimed subject matter is not limited in this respect. The operation and function of a pleniron 200 are discussed in further detail, below.

Figure 6:
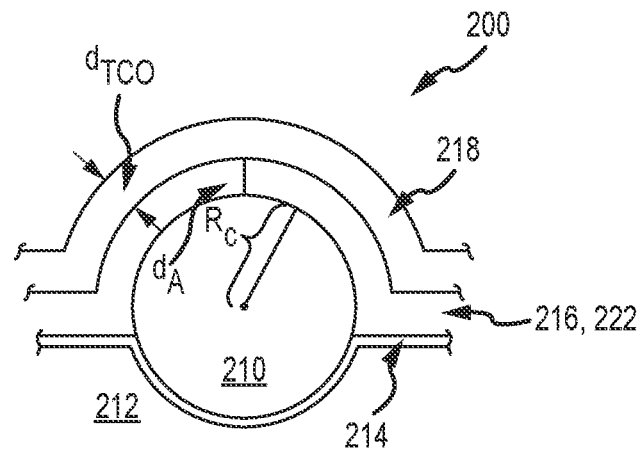
FIG. 6 and FIG. 7 are diagrams illustrating structural proportions of an example pleniron 200 and its components in accordance with one or more embodiments.
Figure 7:
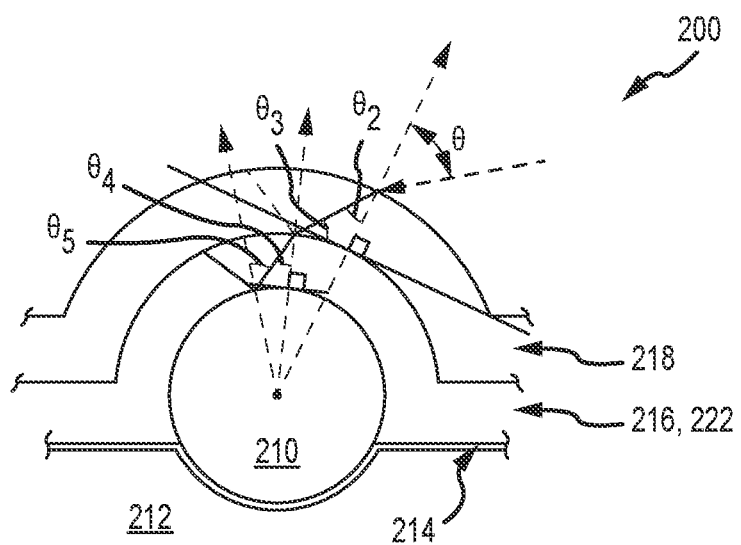

Referring now to FIG. 6 and FIG. 7, proportions of a pleniron 200 and is component structures in accordance with one or more embodiments will be discussed. As pleniron 200 may refer to a photovoltaic device that can be assembled into an array, module, or overall device to utilize broad spectrum electromagnetic radiation to produce electrical power. Such a device may comprise a plurality of plenirons 200, a unit device that may be arranged into regular or irregular spaced array formats such as array 110 of FIG. 1 to make electrical power from incident photons from a light source such as the sun 118. The pleniron 200 may be considered as a basic unit device that can produce power. The assembly of multiple plenirons into the aforementioned array may be synergistic in its production of electrical power. A pleniron based device may be optimized for a solar power system 100 to capture of incident photons using optical dielectric properties in selected proportions including, but not limited to, material thicknesses, pleniron core size, optical indices of refraction, and optical attenuation coefficients. pleniron 200 uses optical proportionality to provide a desired electromagnetic wave, Total Internal Reflection (TIR) properties to trap incident light and to prevent reflection and re-emission of captured photons. In one or more embodiments, the layer proportionality of pleniron 200 may adhere to the following function:

$$\sin^{-1}\left(\frac{n_2 R_c}{n_1(d_2 + d_3 + R_c)}\right)$$

In the above function, n2 is the index of refraction of a Transparent Conductive Oxide (TCO) layer 218 as the outer layer of the pleniron, n1 is the index of refraction of the material 220 outside the TCO 218, usually air or a low index filler, $d_A$ is the thickness of the absorber 208, in this case the N-doped or P-doped semiconductor layer 216, over pleniron core material 210, $d_{TCO}$ is the thickness of the TCO layer 218, and the $R_c$ is the diameter of the underlying pleniron core 210. FIG. 6 shows these proportions of pleniron 200 in cross-section.

A mathematical expression that relates the angle, θ, of a ray of light 120 from a point source such as the sun 118 to the refracted ray inside of an optically dense material providing the angle relative to a radial ray from the center of the pleniron core 210 is shown, below. Likewise, the same expression also may be used to determine the refracted angle in a material with arbitrary index, incident from a larger radius material with a different arbitrary index:

$$\theta_{in} = \sin^{-1}\left(\frac{n_1 \sin(\theta_1)(d_2 + d_3 + R_C)}{n_2(d_3 + R_C)}\right) \quad \text{Eqn 1}$$

The variables of Equation 1 are the same as listed, above, for pleniron 200. The following expression provides the minimum angle of incidence, from air 222, or whatever other material, that the light from the source is incident from, encapsulant polymer, and so on, into the transparent conductor layer 218 over the semiconductor layer 216 and/or semiconductor layer 222 to provide total internal reflection inside of the transparent conductor layer 218 alone. While this traps the light within the structure, it does not guarantee light is trapped uniquely in the absorber 208. The results leading to Equation 1 ensure that:

$$\theta_{Min(air-TCO)} = \sin^{-1}\left(\frac{d_{TCO} + R_C}{d_A + d_{TCO} + R_C}\right)$$

The mathematics leading to these expressions were derived from optical physics and first principles using, in part, geometric and trigonometric analysis similar to that obtained from FIG. 7. Note that the relations provided above allow derivation of the subsequent angles of each ray, even viewed as wave phenomena, from one layer to another, to allow the determination of critical limiting angles that provide nearly complete light trapping. Such is the outcome of Equation 1. It should be noted that, with the decreasing radii of each subsequent layer, and the increasing index off refraction of each layer inward, the probability of light trapping increases far faster than a planar photovoltaic device could achieve. This is understandable easily from the illustration above, by noting that, due to the curved surfaces, the light ray near the angle marked $θ_3$ to the interface to that marked $θ_4$ is longer than that which would otherwise impinge on the perpendicular line in the TCO layer 218, which would of course occur in a planar cell, thereby making more oblique the angle of incidence onto the surface of semiconductor layer 216. It is precisely this slightly added path length, onto a curved geometry, which provides the design of pleniron 200 with the potential to guide light and trap it without loss, or nearly without loss. The more oblique angle onto the underlying layer decreases the chances of a re-transmission out of the structure once it is transmitted into underlying layers.

Figure 8:
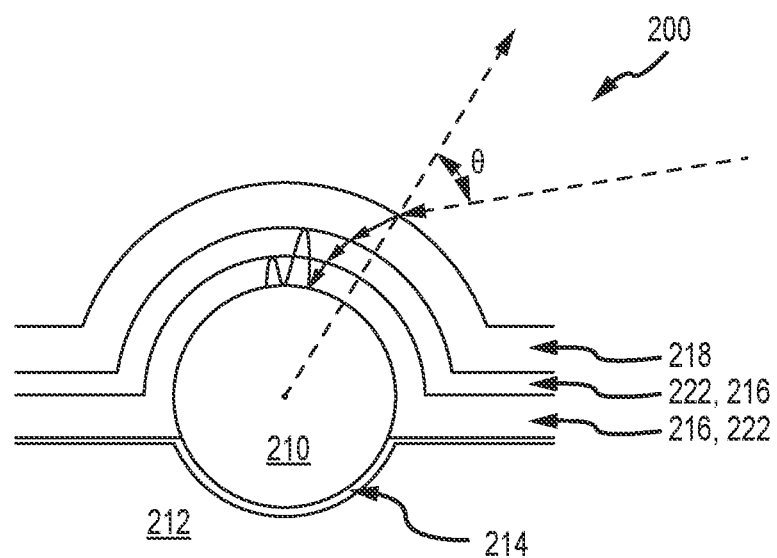
FIG. 8 is a diagram of an example ray trace illustration of total internal reflection in the absorber layers of an example pleniron with a degenerate semiconductor or conductive interior in accordance with one or more embodiments.

Referring now to FIG. 8, an example ray trace illustration of total internal reflection in the absorber layers of a pleniron 200 with a degenerate or conductive interior will be discussed. A pleniron 200 may implement Optical Volume principles, where the device acts as a meta-material that is both absorptive and transparent. As shown in FIG. 8, due to the proportionality, light is trapped by Total Internal Reflection, similarly to lens design principles, and is attenuated at the point of entry in the 3-dimensional device. The layers act as optical waveguide resonators to concentrate light in the X-Y plane, parallel to the underlying substrate 212, but homogeneously distribute the Density of photon states in the z-direction, the optical depth of the device perpendicular to the X-Y substrate plane.

Figure 9:
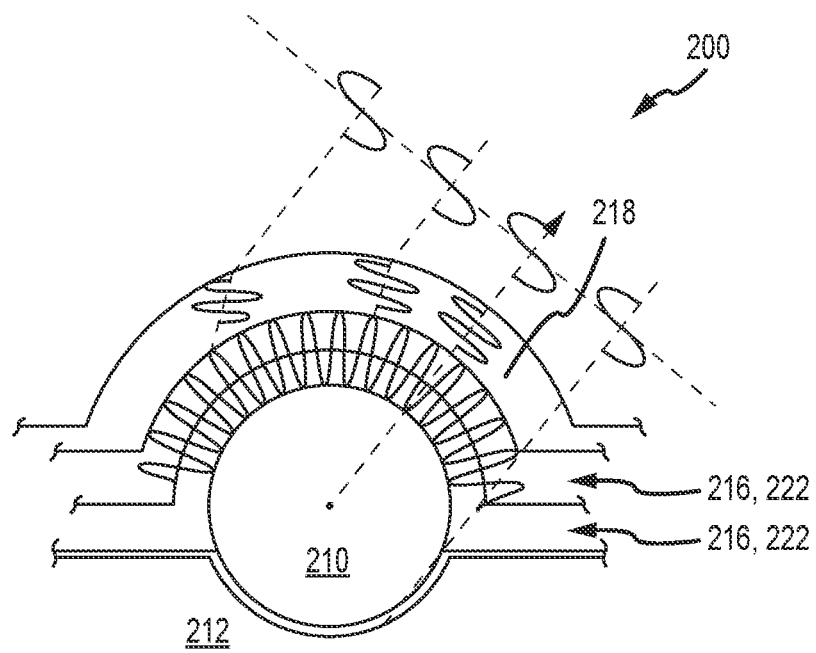
FIG. 9 is a diagram of a single, monochromatic plane wave that transforms in the wave guiding surfaces on all sides of the absorber of an example pleniron, to a resonant multi-modal resonance in accordance with one or more embodiments.

Referring now to FIG. 9, a single, monochromatic plane wave that transforms in the wave guiding surfaces on all sides of the absorber 208, to a resonant multi-modal resonance will be discussed. A pleniron 200 may utilize optical depth, wherein the optical indices and thicknesses of the device layers capture and retain electromagnetic radiation at broad band wavelengths, for example approximately 300 nanometers (nm) to 1100 nm depending on material system chosen by the manufacture. In so doing, a pleniron 200 is able to utilize the entire volume of pseudo-absorber 208 material, the optical depth of the device, such that the number of photons in the device at an instantaneous moment, t, is increased.

In one or more embodiments the pleniron 200 may be optimized for Optical density of photon states spatial homogeneity through the concentration of light in axes parallel to the underlying substrate 212, and propagation of light, from the points of light entry, in the vertical direction, perpendicular to the substrate 212. Although propagation in spherical, multimodal, or curved granular-based annular waveguides will be in all three coordinate directions, once trapped within the layers and core of the device, it is the vertical direction orthogonalized which provides an optical thickness without corresponding attenuation. For these reasons an array 110 of plenirons 200, referred to herein as a plenistell, is a meta-material since it has synergistic properties that may be difficult if not impossible to achieve from bulk materials. Since the optical thickness is expanded such a plenistell meta-material may be regarded as transparent, to its full depth, and absorptive simultaneously.

The optical trapping and retaining structure for an example pleniron 200 as described herein may include smooth interfaces between vacuum/air, window-layer conductive oxides, semiconductor layers, core materials, and back electrical contacts and reflectors. The option for smoothness, in general, is that the peak to peak features are spaced closer than the wavelength of light in the material, referred to as X in vacuum divided by index of refraction of the material, divided by ten. This is summarized in the below equation:

$$d < \frac{\lambda}{10*n} \quad \text{Eqn 2}$$

In the embodiment discussed, above, varying degrees of roughness, deviating from that shown in FIG. 9 may provide performance at a reduced value from the optimum. Non-optimum roughness values will provide advantage in optical volume enhanced density of states homogeneity, although performance will degrade by a factor of at least $d^2$ as roughness increases. In addition, the peak to peak value, may be appended by a peak to valley distance such that the average surface deviation angle be less than or equal to about 8 degrees. Such an arrangement may encompass values in excess of this, although the performance of the cell may degrade by a factor of at least the following with increased deviation angle:

$$\Delta P = \sec^2(\theta)$$

In one or more embodiments, pleniron 200 may be considered a light trapping, retention, and/or processing optimization device that involves the exterior vacuum or air to transparent conductive oxide interface being comparably thick to the underlying semiconductor layer 216 wherein light incidence from virtually all angles may not be of grazing incidence and retransmission within the TCO 218, nor grazing incidence and infinite TIR retention within the TCO. This involves optical optimization such that the semiconductor layers and core, of known indices of refraction as a function of wavelength-dispersion relation, accept and retain the electromagnetic radiation. In such an embodiment, the TCO 218 to absorber 208 thickness, with most semiconductor and TCO materials, be of ratio of about 1 to about 1.5, that is the ratio of the thickness of the TCO 218 to the absorber 208. Ratios within about plus or minus 50% of this value may still function.

In one or more embodiments, pleniron 200 utilizes the optically tuned waveguide volumes, whether annular or optical resonators, for optical path length for attenuation and exciton generation. This length is different from a planar device vertical or scattered optical path length since all levels of the device can be reached by un-attenuated light before entry into the device occurs. To take full advantage of all incident angles, and full optical volume, the plenirons 200 in an array 110 should not shadow each other significantly. Mitigation of shadowing may be considered an optimum wherein the spacing of the plenirons 200 in the array 110 are spaced such that their bases do not occlude each other by more than about 20% at the most open viewpoint. For example, if the completed plenirons 200 were about two microns in radius each, center to center spacing would be no more than about 7.2 microns as would be in accordance with the following equation:

$$S(CTC) = 0.8 * R_D + 2 * R_D \quad \text{Eqn 3}$$

Although regular spacing of the plenirons 200 in the array 110 would be more predictable and create a regular angular dependence of the power generated, randomly distributed devices would also function with similar capability as long as the randomness in spacing averaged to nearly the above mentioned values. In general, if the occluded area of the substrate exceeds more than about 12% of the surfaces of the plenirons 200, then the performance may be degraded similarly. No more than about 25% of the 90 degree incident area of the device should be planar floor area. Similarly, off-angle at approximately 45 degrees the devices in the array should not occlude more than about 20% of the nearest neighbor devices under worst-case circumstances, azimuthal variations. Although it is acknowledged that packing the plenirons 200 to such an extent that occlusion is greater than about 50% will still provide benefit over planar devices, especially off-angle, it would be expected that the array 110 performance may be degraded by more than the sine of the incident angle squared times the occlusion ratio, at least.

Figure 10:
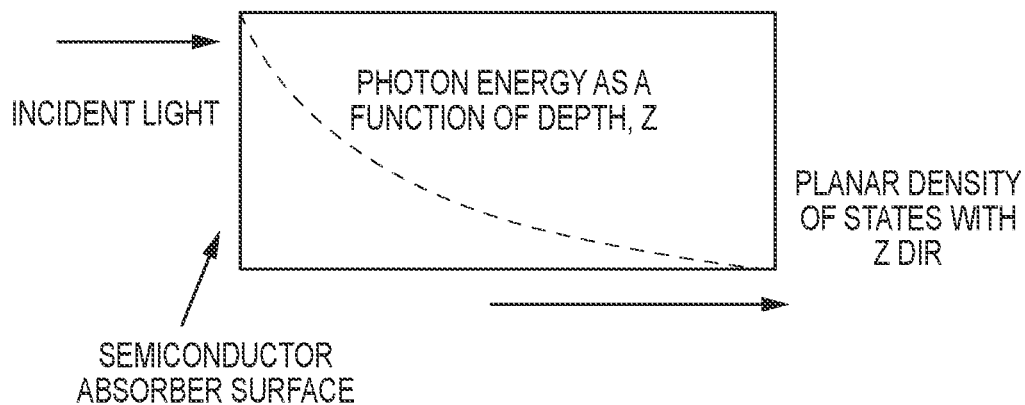
FIG. 10 is a diagram illustrating an example of the density of states for a planar photovoltaic device for comparison to a pleniron photovoltaic device in accordance with one or more embodiments.

Referring now to FIG. 10, an example of the density of states for a planar photovoltaic device will be discussed. In one or more embodiments, one performance benefit of an array 110 of plenirons 200 may be in peak power generated, as well as integrated power over all incident angles and diffuse light incidence. Because the optical volume, and TIR, characteristics of the array 110 or plenirons 200 allow far higher power production at more oblique angles of incidence than planar devices, up to about 2× to about 2.5× the integrated area under the exponentially decaying attenuation curve of a planar array as shown in FIG. 10 over a full daytime can be achieved.

Figure 11:
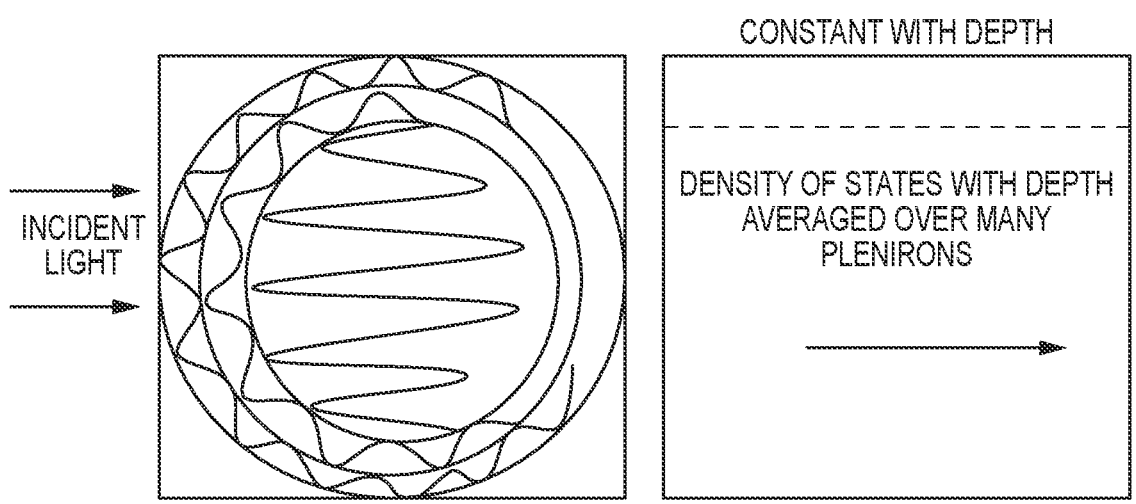
FIG. 11 is a diagram illustrating the density of states for a pleniron photovoltaic device in accordance with one or more embodiments.

Referring now to FIG. 11, the density of states for a pleniron photovoltaic device will be discussed. In a pleniron 200 the optical density of states is increased in lateral directions by each individual pleniron in the array 110 focusing the light increasingly inward, by Total Internal Reflection, as discussed above, and retaining the light in a cavity resonator of the correct proportional dimensions. In the vertical direction, out of the substrate 212, the optical density of states is homogeneous and even. Although the pleniron 200 may be inhomogeneous in its construction, due to plenirons 200 being distinct from the spaces between them, the effective density of states, taken as an average over a large area of many plenirons 200 in the array 110, is a constant in the z-direction. The pleniron 200, due to Optical volume effects, will produce a step-function curve, proportional to the optical depth of the device, as shown in FIG. 11.

To achieve this optically, the pleniron core 210, as a function of material set the absorber material, window layer, and TCO, may be sized such that 99%, or about 3 Skin Depths, of optical absorption path length are traversed within one to five reflections across the interior of the core material and/or the window layer. This depends on the material set's absorption coefficient, or the complex part of the index of refraction, k. This varies by the dispersion relation with wavelength in the material. Some examples of material sets that may be utilized in example embodiments are shown in Table 1, below.

TABLE 1

Material Properties of Example Material Sets

| Material Set | n (Index) | k (extinction) | Eg (Band Gap eV) | Max Wavelength | 99% Path Length |
|---|---|---|---|---|---|
| Polysilicon | 4.47 | 1.95E−02 | 1.1 | 1.13E−06 | 4.70E−06 |
| Crystal Silicon | 3.76 | 1.27E−01 | 1.1 | 1.13E−06 | 1.32E−04 |
| Amorphous Si | 4.96 | 2.19E−02 | 1.75 | 7.10E−07 | 5.20E−07 |
| Gallium Arsenide | 3.42 | 1.91E−01 | 1.42 | 8.74E−07 | 3.25E−05 |
| Cadmium Telluride | 2.68 | 1.87E−02 | 1.44 | 8.62E−07 | 2.53E−06 |
| CIGS | 2.47 | 2.02E−02 | 1.49 | 8.33E−07 | 7.20E−07 |

In one or more embodiments pleniron 200 may comprise a meta-material. The extinction coefficient, as one example, of the silicon, and as one of many possible embodiments, as the absorber 208 material, allows a certain path length for the light within it as in Table 1, above. If measured macroscopically, however, the extinction coefficient of the pleniron 200, for instance as measured in a Reflectometer or Spectrophotometer, will be nearly infinite. This is due to the light absorbing and retention properties possible due to geometry and total internal reflection.

In one or more embodiments, the layer doping profiles and the intrinsic material properties may be tuned, or optimized, to maintain the appropriate widths of the depletion region between the N and P semiconductor layers, weighted for a radial junction with an inverse square concentration gradient. The depth of the depletion region, which should be designed to extend over at least 90% of the width of N and P regions, is determined by the following parameters: The intrinsic semiconductor number density in the Conduction and Valence bands respectively:

$$n_C = \exp\left(-\frac{e*E_{gap}}{2k*T}\right)\left(2\left(\frac{2\pi k*m_e(m_{eff}^e)*T}{(\hbar)^2}\right)^{3/2}\right) \quad \text{Eqn 4}$$

$$n_v = \exp\left(-\frac{e*E_{gap}}{2k*T}\right)\left(2\left(\frac{2\pi k*m_e(m_{eff}^h)*T}{(\hbar)^2}\right)^{3/2}\right) \quad \text{Eqn 5}$$

Here the difference in the two formulas is simply the difference in the lattice effective masses of holes and electrons for the valence and conduction bands respectively. This leads to the Built-In potential across the depletion region to be:

$$V_{bi} = \frac{kT*\log\left(\frac{n_A*n_D}{n_c*n_v}\right)}{e} + E_{gap} \quad \text{Eqn 6}$$

Here, the $n_A$ and the $n_D$ are the number concentrations in the dopant acceptor and donor bands. $E_g$ is the band gap energy.

Note that the electric field across the depletion region, which may be maximized to achieve high exciton acceleration and lower thermalization losses, is this $V_{bi}$ divided by the width of the region. If the material properties significantly reduce charge screening such as, Debye or Fermi-Thomas screening, naturally a thinner layer system will achieve higher electric fields. The resulting penetration of the depletion region into the N material will be determined as follows:

$$W_N = \sqrt{\frac{2\epsilon*\epsilon_0*n_A*V_{bi}}{e*n_D(n_A+n_D)}} \quad \text{Eqn 7}$$

The penetration of the depletion region into the P material exhibits a similar profile. The dopant concentration in a regular layer, non-radial, or planar thin film, would be proportional to the following:

$$dC = n(orp)*\exp\left(\frac{e*E_A}{kT}\right) \quad \text{Eqn 8}$$

Once the uncorrected dopant levels are determined from the above, to obtain the full depletion across the P and N layer regions, the following weighting factor is used in the outer most layer, whether it be a P or N semiconductor layer, to determine the final doping level. Note, as a rule, that the doping concentration would be denser in the underlying layers, since the outer regions would be of greater total volume. One principle is that the total number of free charges, at a particular operating temperature, may be approximately equivalent across the DZ. The dopant correction factor for the radial junction is:

$$\frac{(d_N+R_c)^2-R_c^2}{(d_{int}+d_N+R_c+d_P)^2-(d_{int}+d_N+R_c)^2} \quad \text{Eqn 9}$$

Refer to FIG. 4 for reference of the layer thicknesses in Equation 9. Note here, as shown in cross-reference sections, that back contact 214 is a high conductivity "mirror" layer used for pleniron cores 210 that are semiconductor absorbers, semiconductor layer 216 and semiconductor layer 222 are doped semiconductor regions, P or N respectively, intrinsic layer 224 is an intrinsic semiconductor region for charge depletion, and TCO layer 218 is the transparent conductor. Note that in embodiments without an intrinsic region, which not provided for regular P-N junction systems, the din in Equation 9 is set to zero.

Figure 12:
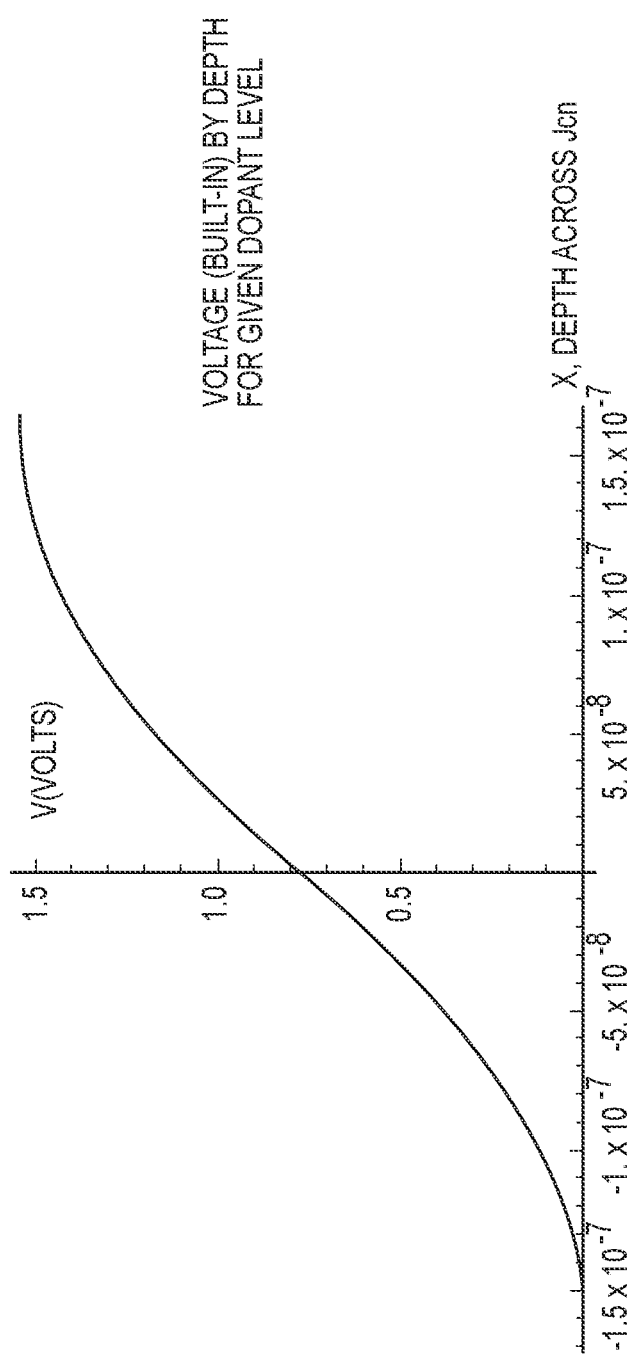
FIG. 12 is a graph of voltage versus junction depth of an example pleniron in accordance with one or more embodiments.
Figure 13:
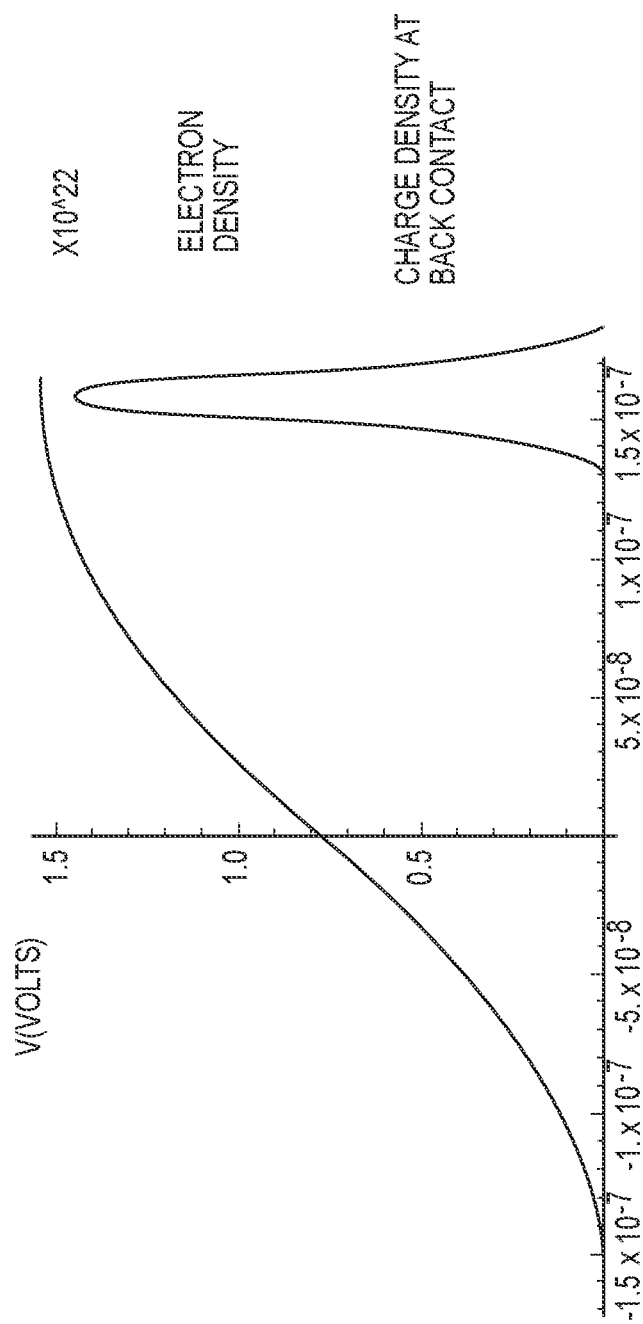

Referring now to FIG. 12, a graph of voltage versus junction depth of a pleniron in accordance with one or more embodiments will be discussed. The doping correction factor may be multiplied by the previous dopant concentration calculation, that is in the doped semiconductor layer with the greater total volume, outside layer, to ensure that the total free charge number on each side of the metallurgical junction is equivalent. The potential profile of the resulting junction is similar to the following, assuming that the active dopant density is equivalent across the metallurgical junction as shown in FIG. 12. The graph of FIG. 12 above illustrates conditions of the use of poly-nano crystalline silicon, with commensurate effective masses of 0.49 and 0.98 electron mass for electron and holes, respectively. In addition, the temperature is standard room temperature of 300 Kelvins. The band gap is set at 1.1 eV, the real part of the dielectric constant is 3.2 and the active dopant atom number density (per m^3) is 10^22 in each region.

It should be noted that the voltage of FIG. 12 is larger than the band gap of the material. This is a natural occurrence of the semiconductor equations above, where the band gap is the starting point of voltage, only first term, but also dependent on the logarithmic term which adds to the voltage if the numerator is larger than the denominator, for example if the number of active dopant carriers, $N_a$ and $N_d$, is larger than the intrinsic number in the conduction and valence band or bands, respectively. This involves a high quality semiconductor material with a Debye, or Thomas-Fermi, screening length of greater than approximately 20% of a given layer thickness. In addition, as mentioned above, the doping levels delineated are used in the layer thicknesses outlined or quasi-neutral regions of the PN junction will act as resistances which decrease the open circuit voltage ($V_{oc}$). The doping levels also may not be so great that they either involve negligibly small thicknesses for full depletion, or they cause degenerate dopant band splitting into wide regions on the $E_c/E_v$ energy diagram.

The situation of a nearly fully depleted region, lack of quasi neutral regions, high-quality material, and/or non-degeneracy causes there to be massively dense charge clusters near the back and front contact materials. This is especially true at the back contact where the conductivity is higher and the radius is smaller than the front contact. The PN junction, if properly designed, as above, will naturally cause equilibrium of spatially separated like charges with high densities. The region between these two charge dense clouds will have charge densities up to about 10 to about 14 orders of magnitude less charge than the intrinsic material per m^3.

Figure 14:
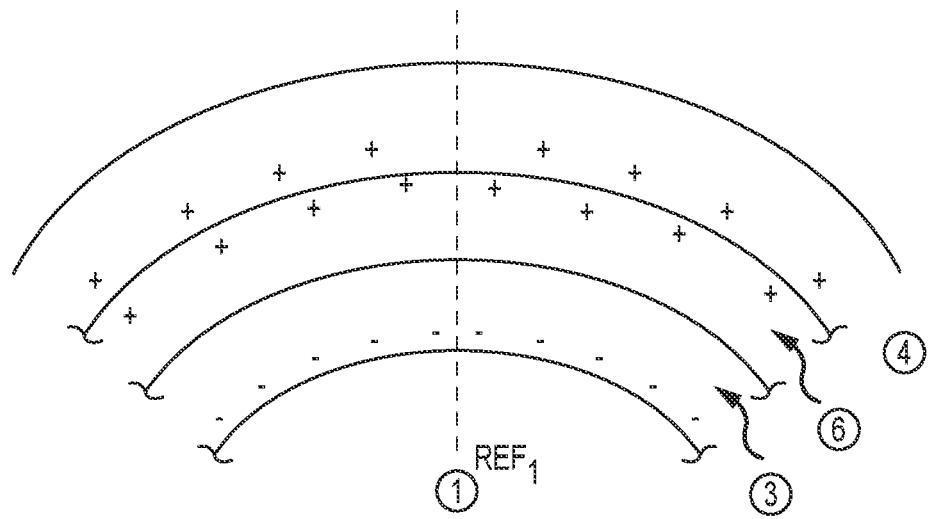

Referring now to FIG. 13, FIG. 14, FIG. 15, FIG. 16 and FIG. 17, graphs and illustrations of charge density in a pleniron in accordance with one or more embodiments will be discussed. When the charge density at the back contact 214 has been increased by the equilibrium design of the junction, the charge density, plotted on the previous potential graph, will appear similar that shown in FIG. 13. This will allow a locally dense charge of fermions, electrons, at the back contact that will have a Full Width at Half Maximum (FWHM) of less than about 1% of the width of the spatial layer. In the case of the nano-crystalline silicon, of high quality, this will be about 5-10 nm or less. Likewise, a similar concentration of the opposite charge carrier, in the present case within an N-type window layer, holes, forms either near the interface or within the transparent conductor 218. In addition, as shown in FIG. 15, the radial electron and hole densities (charge density) along the reference line in FIG. 14, is as follows. In the class of embodiments with semiconductor pleniron cores 210, the electron distribution, commensurate with the optical density and that of holes, is illustrated similarly to FIG. 14.

Figure 16:
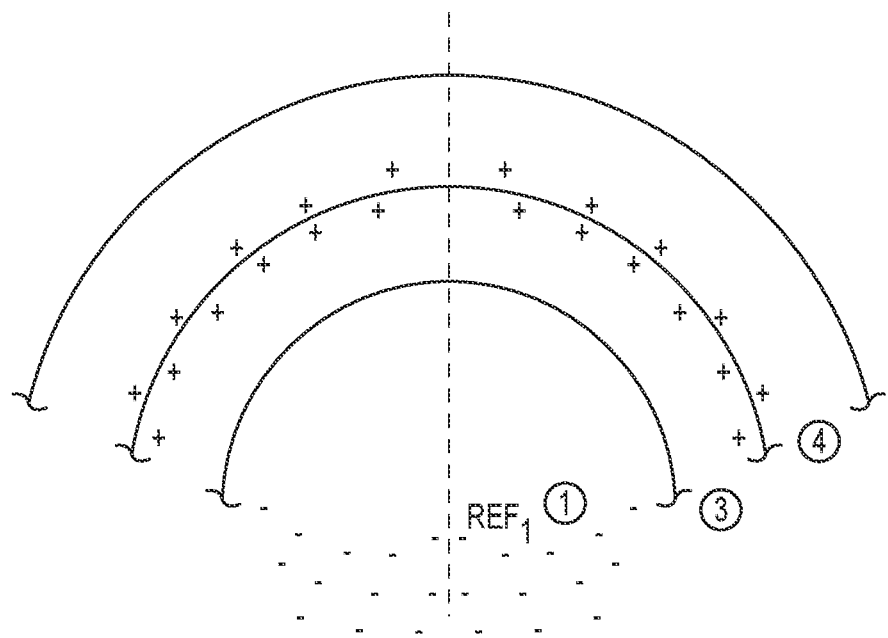

As shown in FIG. 16, if the local density of the fermions, confined by the built in electric field of the junction equilibrium and the back contact Schottky effect, is greater than the Plasma frequency, defined below, then this charge cloud will act as an elastic mirror and resonator surface for photons. The electromagnetic radiation will not only reflect from the electron distribution but the electrons will participate in resonation due to their interactions with each other, both Coulombic, and quantum mechanical exchange forces, and the incident light. The plasma frequency is:

$$\omega_p = \sqrt{\frac{ne^2}{m_{e,h}^* \epsilon_0}}$$

Where $m_{(e,h)}$ are the respective hole and electron effective masses, $\epsilon_0$, is the permittivity of free space, and n is the concentration of electrons in the highest density region, number per unit volume. The electron distribution in a radially distributed junction, as described above will be non-planar, and be represented by the following:

$$eDist(r, \lambda_0) := \frac{r \exp\left(-\frac{r^2}{\lambda_0^2}\right)}{\lambda_0}$$

Using a Debye screening length of an appropriate size for the material, determined by the following:

$$\sqrt{\frac{10.6 * e * \epsilon_0 * n_e}{1.36}}$$

Figure 17:
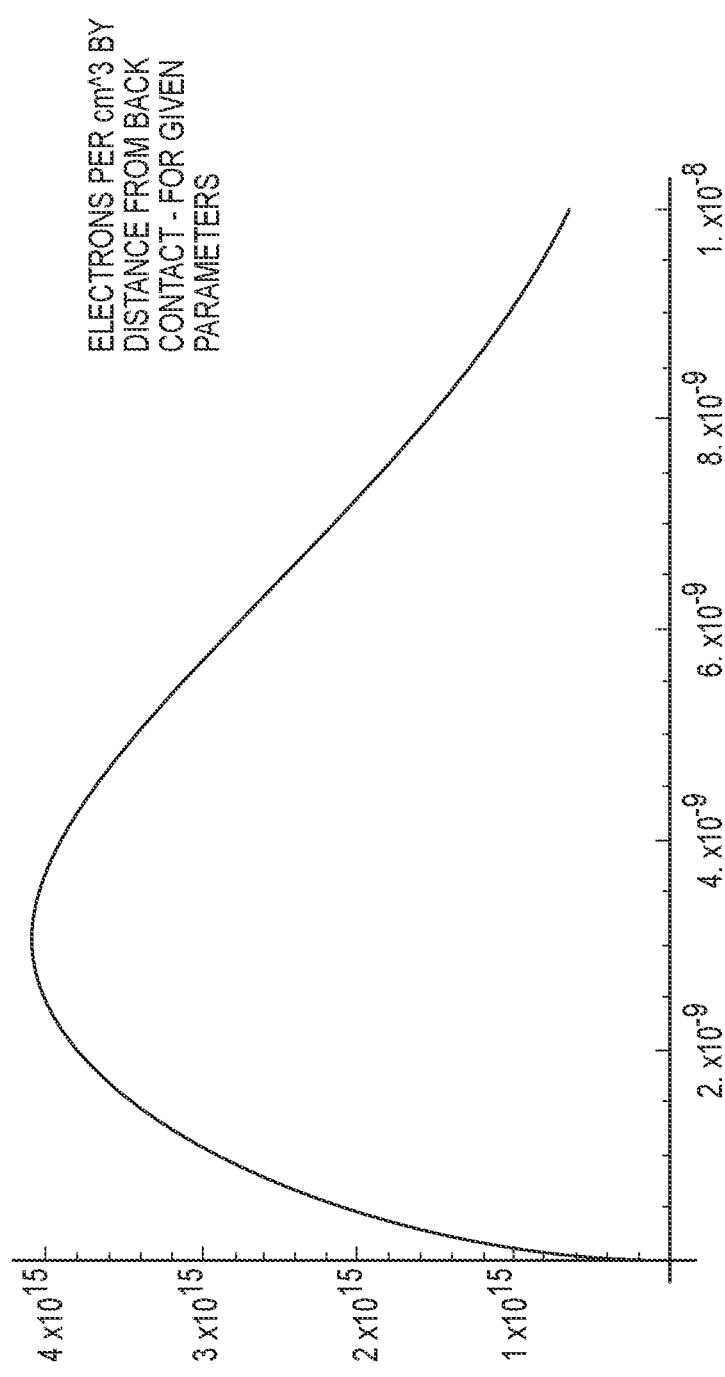

The above expression gives the following graph shown in FIG. 17 of the electron distribution, in a spherically symmetric ring around the radius of the back contact, as a function of distance from the back contact. The vertical axis is the number of electrons per cm^3 as a function of distance from the back contact material. Clearly the maximum is over 4*10^15 electrons. Note that they are confined to a space of less than 100 angstroms. Given the small volume the total electron density exceeds 10^28/cm^3. At this level the resonating electrons can elastically mirror and exacerbate light's interaction.

Typical known waveguides use high conductivity metallic surfaces or coatings to decrease losses from skin-depth effects and decaying evanescent waves penetrating the metal surface at each reflection. However, even with high quality and conductive surfaces there is measurable loss at high frequencies, such as visible light, due to the electric and magnetic field portions of the transverse and tangential components penetrating by 1/e distances of a few atomic monolayers. The fully depleted region in the pleniron 200, which produces the high density charge cloud near the back contact of the device, has a peak charge carrier density at least three orders of magnitude higher than a metal's Sommerfeld model free electron gas. This charge distribution, composed of electrons or holes, responds to the oscillatory fields of the electromagnetic radiation completely elastically and reflects the light without loss. Therefore, the charge cloud will act as a waveguide surface that eliminates skin depth loss and improves the performance of the device. Since the reduction of the evanescent wave reduces optical losses, and removal of photons before exciton generation, the charge cloud reflection effect will appear on an I-V graph as an improvement in device output current.

While all currently known photovoltaic devices are limited in efficiency by exciton thermalization, the short electronic distance, presented as a result of the fully depleted region, will reduce thermalized charge carriers by as much as 90%. Thermalization, or the inelastic scattering of excitons, electron, hole, or both, to produce phonon lattice vibrations as heat due to collisions, is reduced from 10^-8 seconds to a range of 10^-11 to 10^-14 seconds due to two factors. First, the high electric field across the depletion region, in addition to the short distance, causes charge carriers to be accelerated across the junction and into the back contact Fermi-gas in a time far shorter than the minority carrier lifetime of the bulk semiconductor material. Whereas typical carrier lifetimes are on the order of 10^-8 seconds, for non-orientable materials like amorphous silicon, for example, short field regions of several microns can be accelerated to the respective contacts in a matter of as little as 10^-11 to 10^-14 seconds. Second, the lack of quasi-neutral regions in the device, due to the full depletion, removes both charged and neutral locations from acting as inelastic scattering centers or traps. Drift and diffusion, or the pushing of charge carriers through the quasi-neutral regions due to screened Coulombic repulsion, is no longer a factor in the pleniron 200. This will add to the overall current output of the device due to increases in I-V curve fill factor from better Shunt Resistance. Devices with this feature will have Shunt Resistances at least 25% better than corresponding planar thin film devices.

The conversion of photo-created excitons in the depletion region will add to the overall current output from the device once the charge carriers are collected in a metallic Fermi gas at the back or front contacts. This occurs as a result of the additional potential energy, from electrons elevated higher into the conduction band from deeper in the valence band, converting into kinetic energy in acceleration towards the Fermi Gas. The added kinetic energy amounts to a perturbation to the Fermi Distribution function, which is shown in and described with respect to FIG. 18, below.

Figure 18:
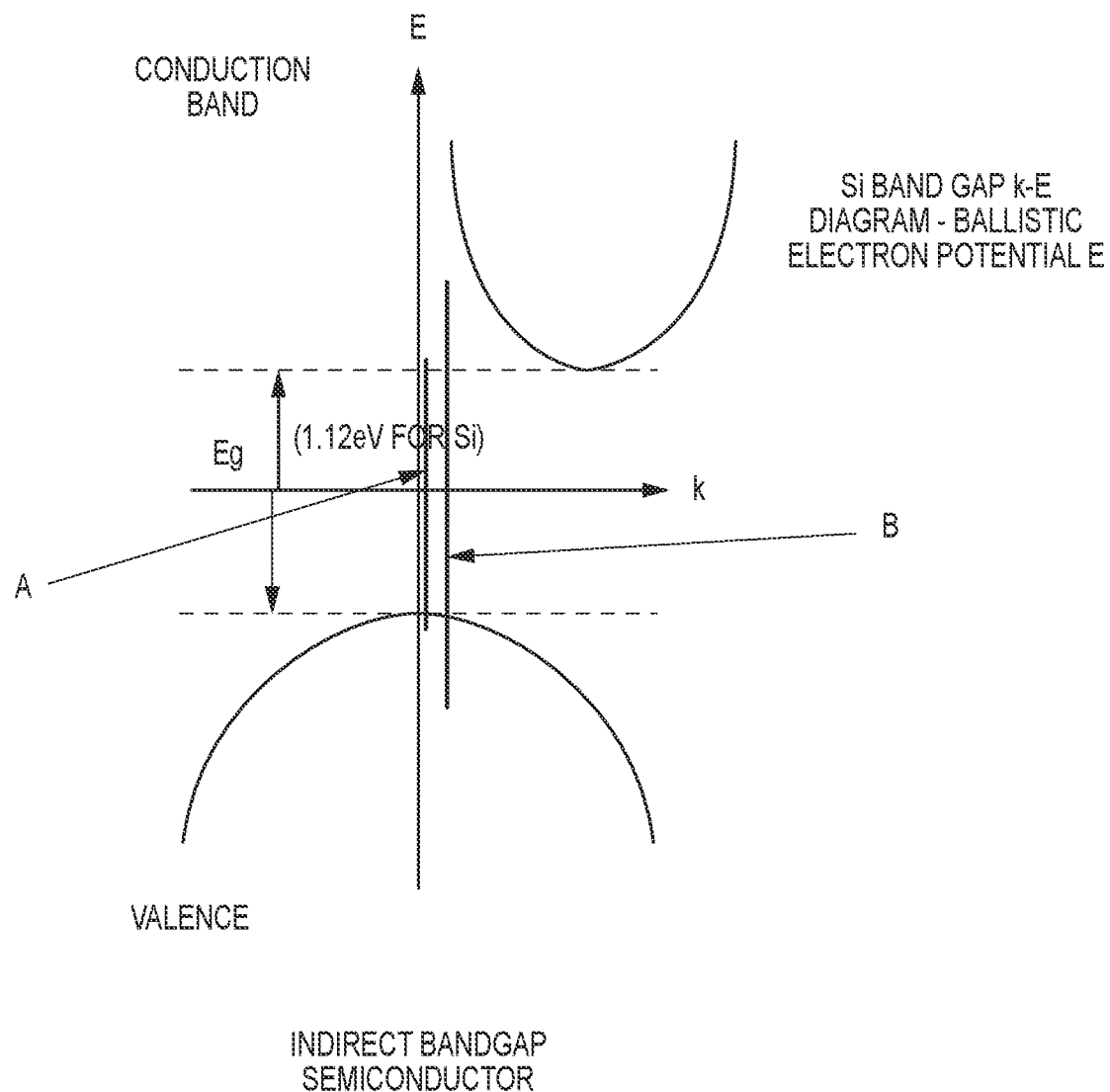
FIG. 18 is an example diagram of the energy band diagram for crystalline silicon, an indirect band gap semiconductor, for analysis of use in an example pleniron in accordance with one or more embodiments.

Referring now to FIG. 18, an example diagram of the energy band diagram for crystalline silicon, an indirect band gap semiconductor, in accordance with one or more embodiments will be discussed. As shown in FIG. 18, the vertical axis is energy (E) and the horizontal axis is the k-vector, or crystalline phonon lattice momentum. Typical photovoltaic devices, with drift diffusion regions allow photon-exciton transformation reactions from band edge to band edge as is shown by the shorter line marked as A. Although the photon energy may be in excess of the gap, the forbidden region, energy, the extra potential energy, may be lost due to scattering and recombination in the drift/diffusion regions. The longer line marked as B is an example of the plethora of more energetic photons that can, in a pleniron 200 with tuned depletion regions, allow the added potential energy to be converted into useable power as output.

Figure 19:
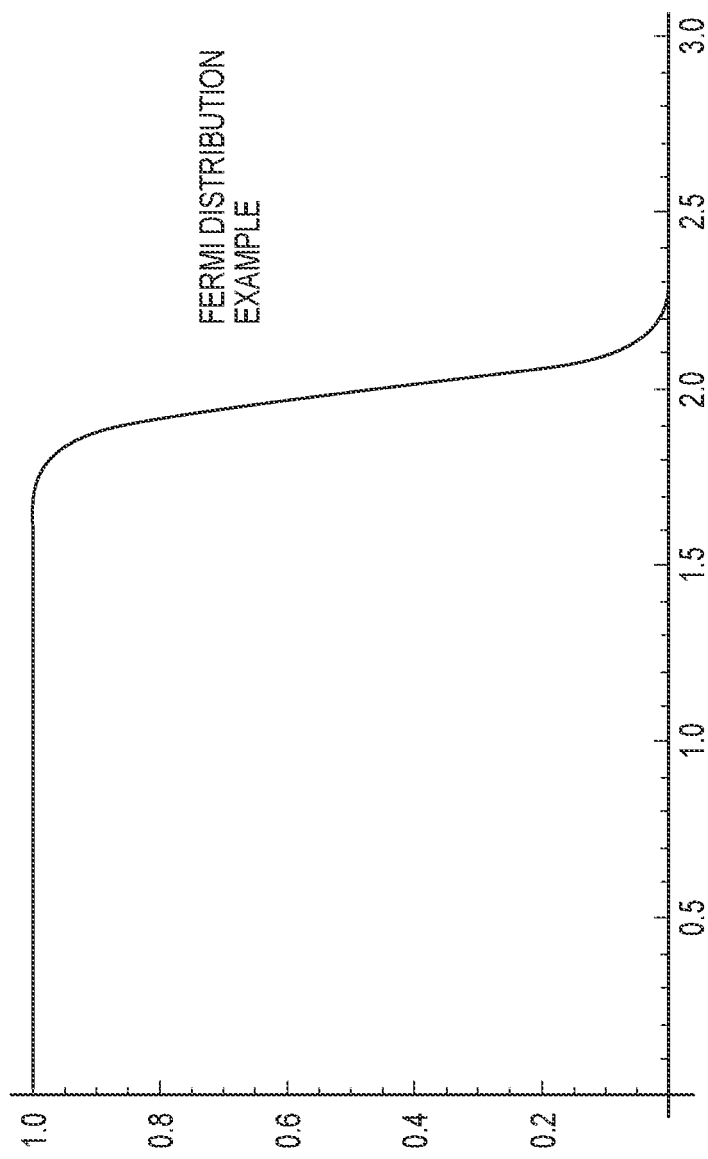
FIG. 19 is a diagram of the plotted Fermi distribution for a Fermi energy of 2 eV and 300 K temperature where the vertical axis is the number of electrons in the state with the energy on the horizontal axis for an example pleniron in accordance with one or more embodiments.

Referring now to FIG. 19, a graph of Fermi distribution for an example pleniron in accordance with one or more embodiments will be discussed. As shown in FIG. 18, the extra length in energy units of eV of the longer line B over the shorter line A is the photon energy, once transformed into exciton kinetic energy that can be recovered as additional power output by a photovoltaic device. The Fermi Distribution is:

$$f(\varepsilon) = \frac{1}{\exp\left(\frac{\varepsilon - \varepsilon_F}{kT}\right) + 1}$$

The electronic metallic density of states is:

$$D(\varepsilon) = \frac{\sqrt{\varepsilon}\,(2m * \varepsilon * m_{\mathit{eff}})^{1.5}}{2\pi^2 \hbar^3}$$

The plotted Fermi distribution of FIG. 19 is for a Fermi energy of 2 eV and 300 K temperature where the vertical axis is the number of electrons in the state with the energy on the horizontal axis. Because they are Fermions and obey the Pauli Exclusion Principle, states of +½ spin and −½ spin are regarded as different states.

Figure 20:
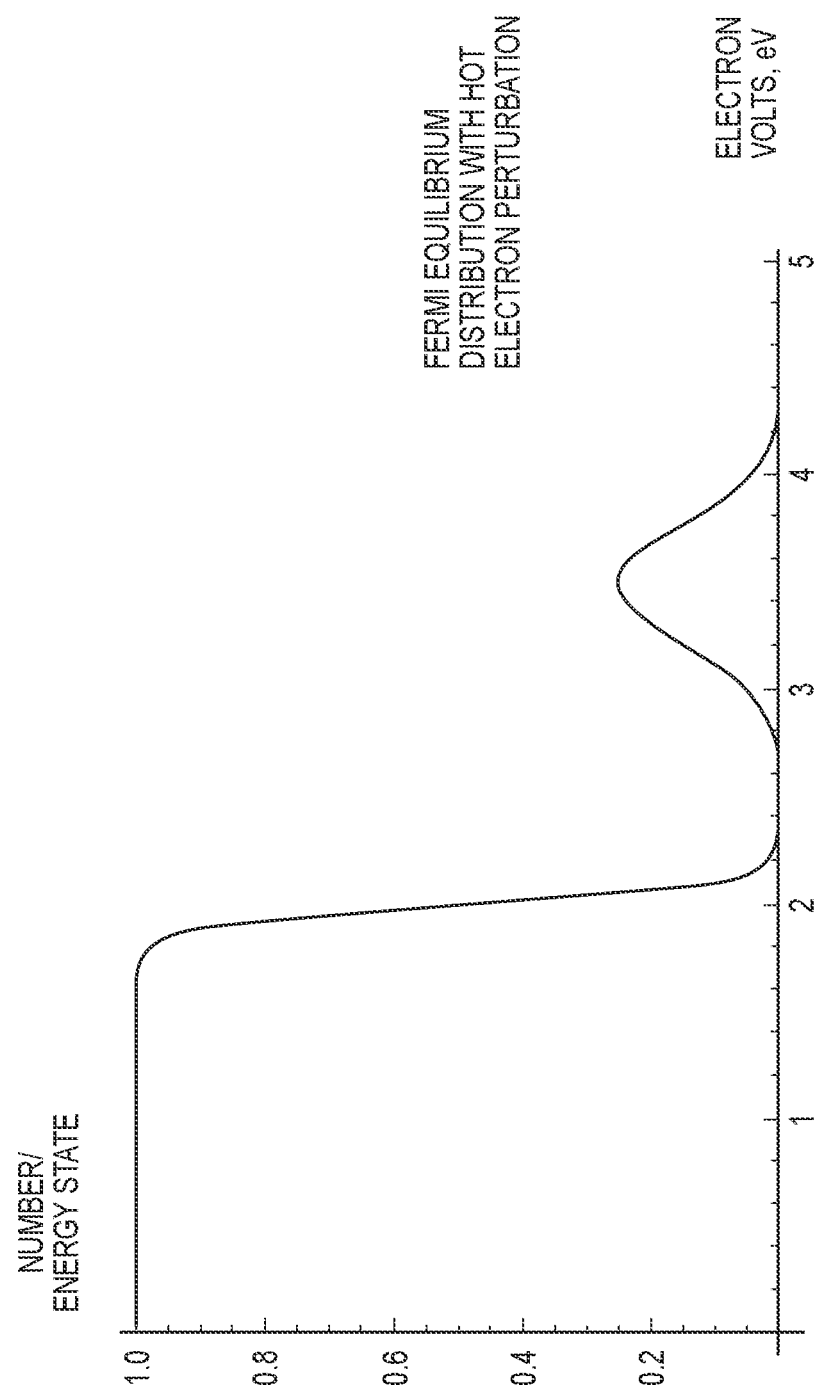
FIG. 20 is a graph of Fermi Equilibrium distribution with hot electron perturbation in a pleniron in accordance with one or more embodiments.

Referring now to FIG. 20, a graph of Fermi Equilibrium distribution with hot electron perturbation in a pleniron in accordance with one or more embodiments will be discussed. The perturbed Fermi distribution function looks like the graph of FIG. 20 when a Gaussian is added that represents an injection of hot electrons. Here the center of the Gaussian distribution of hot electrons is at approximately 3.5 eV with a 1/e width of approximately 0.78 eV. This represents charge carrier excitons, created by energetic photons, being absorbed into the Fermi gas of the metal without losing their energy to inelastic scattering centers in the semiconductor material. The shape of the Gaussian occurs as a result of a statistically random model of the location within the depletion region where the photon is absorbed. The total number of electrons in the perturbed ensemble of electrons is as follows:

$$N_T(\varepsilon) = \frac{\gamma \varepsilon^{1/2} e^{-\mu/kT}}{e^{-\mu/kT} + e^{\mu/kT}} + \alpha e^{\frac{-(\varepsilon - a)^2}{b^2}}$$

Where the first term is the usual number distribution, from the product of the Density of States and Fermi Distribution, and the second term, independent of temperature, is the perturbation.

Calculating the total Internal Energy of the perturbed free electron gas provides the following:

$$U_{Perturb}(T) = -\frac{\sqrt{\pi}\, t^{3/2} \mathrm{PolyLog}_{\frac{3}{2}}(-a)}{2a} - \left[\frac{\alpha}{2}\sqrt{\pi}\left(\mathrm{erfi}\left(\frac{b}{a}\right) + 1\right)\right]$$

Once again the first term comes from the typical Fermi number density, and the second from the perturbation. Once again, the perturbation term is independent of T.

Equating the unperturbed Internal Energy to the perturbed Internal Energy allows us to calculate a new equilibrium electron gas temperature. The higher electron gas temperature immediately leads to higher electron scattering rates and higher individual electron velocities. The higher electron velocities translate directly to higher drift velocity of the electron gas which, under the influence of fields, leads to more current. Referring to the terms as the following:

$$\alpha = \frac{\sqrt{\pi}\, \text{PolyLog}_{\frac{3}{2}}(-a)}{2a}$$

and $$\beta = \frac{\alpha}{2}\sqrt{\pi}\left(\text{erf}\left(\frac{b}{a}\right)+1\right)$$

The change in electron temperature is as follows:

$$\Delta T = \frac{1}{k_b}\left(\frac{\beta}{\alpha}\right)^{2/3}$$

Therefore, the temperature increase is proportional to the ⅔ power of the ratio of the energy contribution of the perturbation to that of the equilibrium electron gas. Since in the non-relativistic regime of the carrier velocities they are proportional to the square root of the temperature, the velocity distribution varies as follows:

$$v(T) = \sqrt{\frac{3}{m_e}}\left(\frac{\beta}{\alpha}\right)^{1/3}$$

Current increases would be proportional to the increase in velocity, cubed, due to the orthogonality of the three coordinate directions:

$$J(T) \propto \left(\frac{3}{m_e}\right)^{3/2}\left(\frac{\beta}{\alpha}\right)$$

In one or more embodiments, the design of an array 110 of plenirons 200 may be considered. Optimization of array 110 is begun with a material system selection, the decision for which is based on process complication, cost, screening/recombination length electronic band gap width performance, and/or optical path length. The performance based factors are discussed briefly, below.

Electronic band gap width may be a factor. Photons with energy less than the band gap energy of the material they are incident upon are absorbed as heat instead of as excitons that can add to power production. For this reason, selection off a material with a smaller band gap (crystalline silicon has 1.1 eV as opposed to amorphous Si with 1.75 eV) is preferable so that light in the red to infrared parts of the solar spectrum can be captured. This factor is balanced and weighed against some of the other factors, below.

Screening and recombination length of a semiconductor is a factor to consider since this will not only limit the device open circuit voltage $V_{oc}$ but also will affect output current. The carrier lifetime is also related to this factor. If the lifetime of a carrier (portion of a created exciton) is less than the average time for the carrier to get out of the semiconductor material in the device, then the carrier will likely be absorbed by inelastic collisions in the material and recombined (electrons with holes and vice versa). The probability this will occur is greater in materials that are disordered, such as polycrystalline, with random grain boundary orientations, and amorphous materials, which have no regular structure.

Direct and Indirect Band Gap materials are another factor. The energy band diagram of a semiconductor material is a flattened out version of the surface of the First Brillioun Zone in lattice phase space (momentum and energy space). Conduction band minima and valence bands' maxima may not necessary coincide in the same region of momentum space, the k direction. This means that raising the energy of an electron itself is not sufficient in an indirect bandgap semiconductor since the v-band maxima is not directly below the conduction band minima. A momentum, or lattice phonon transition is also necessary. The probability of this is less than in a direct bandgap semiconductor, so optical path lengths in crystalline silicon is much longer than in direct band gap materials.

Cost and process considerations also may be factors. Although amorphous silicon has a very short carrier lifetime, causes recombination readily, and has a short band gap, it is very inexpensive to produce and can be deposited by equipment in vacuum in short time frames for high throughput. It can also be deposited at relatively low temperatures so that it does not affect the integrity of other materials (prior to the a-Si or subsequent) or their interfaces, such as thermal delamination. Prior to the pleniron 200 device, crystalline silicon has been known to have a very wide band gap, low carrier recombination rate, be highly ordered, requires high temperatures to produce, and has a long optical path length. As noted above, however, in a 3D device a long optical path length becomes a positive since less material is used reducing cost. The meta-material-based pleniron 200 device works as if it is thicker than it actually is.

Material Selection may determine other factors. Once the material system selection has been made, on the basis of performance and cost, and the bulk properties of the absorber material is known, the sizes of the layers are determined on the basis of previously discussed rationale.

The pleniron core 210 is made to such a size that about 90% to about 99% absorption probability occurs within three passes across an average diameter. If the pleniron 200 is made such that the core is conducting, as in another embodiment illustrated later, and the absorber layer is a conformal pseudo-spherical layer over the conductor, then the layer thickness of that material also determined according to the argument of the ArcSin[ ] function in Equation 1 discussed, above. Since this ratio, the argument, produces the minimum angle at which light from air will experience total internal reflection inside the underlying absorber material, a reasonable selection of the ratio is made. If a selection of about 0.5, for instance, is made, then any compound angle of incidence, meaning the multiplication of the direction cosines of both theta, the angle relative to the normal of the substrate, and phi, the angle around an individually considered pseudo sphere, greater than 30 degrees will be totally internally reflected inside the absorber material and trapped completely. The remaining π/6 subtended solid angle more normal to the angle of incidence in θ is refracted into the absorber 208 and kept there in accordance with its polarization's reflection probability. This is shown below for a material, such as Indium Tin Oxide, as an example, as the transparent conductor, with light incident from air.

Figure 21:
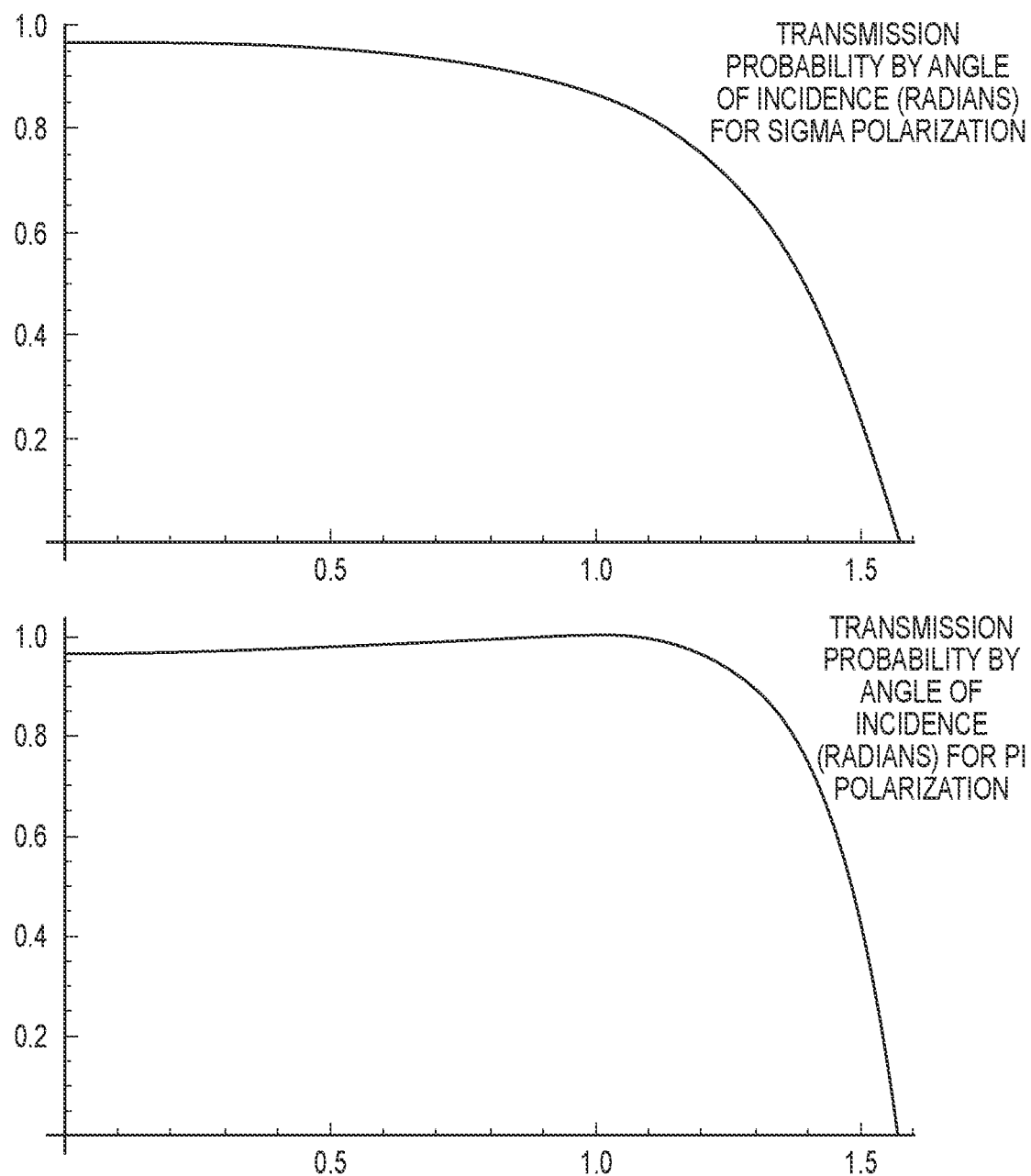
FIG. 21 is an illustration of two graphs showing transmission probability by angle of incidence for Sigma and Pi polarizations, respectively, for a pleniron in accordance with one or more embodiments.

Referring now to FIG. 21, graphs of transmission probability by angle of incidence for Sigma and Pi polarizations, respectively, for a pleniron in accordance with one or more embodiments will be discussed. From the graphs shown in FIG. 21, the Pi polarization may be preferable at higher, more glancing angles. Since white light is a linear combination of both the Pi and the Sigma polarizations it is advantageous that the pleniron maximizes absorption for near normal incidence in the sigma polarization, but takes full advantage of the nearly total absorption of the Pi polarization at off-angle or around the sides of the pseudo sphere of the device. Since polarization is determined by the plane of incidence of the light, which changes continually around the sidewalls of a pseudo sphere of a pleniron 200, the Sigma is accentuated at near normal incidence, and the Pi polarization is accentuated for all other more glancing angles.

Provided with the argument for the ArcSin function for Equation 1, and an estimate of the required minimum angle for TIR in the core or underlying absorber film, Equation 1 may be utilized to calculate the thickness of absorber 208. The rule delineated, above, that is of the outer TCO being approximately about 1 to about 0.67× the thickness of the absorber 208, is then used to approximate the thickness requirement of the outer transparent conductor. Although material considerations should be taken into account, such as material resistivity and the series resistance, an appropriate balance may be achieved with optical materials that remain conductive in the layer thickness required for the device's optical properties to function.

With the thickness of TCO 218 determined, and the absorber 208 thickness approximated, Equation 1 may be used to determine the diameter of pleniron core 210 to achieve the desired TIR in the materials. However, the material system must now be taken into account again, for electronic reasons, and process reasons, such that other parameters discussed, above, are fulfilled. This means that, for the pleniron 200 to function optimally, a fully depleted layer may be developed. Equation 7 is then used to determine the dopant concentration of the N (or P) layer necessary to fully deplete the opposing layer beneath it. Equation 9 is then used to calculate the resulting dopant in the other layer (P or N as opposite to above), that is above the other layer (e.g. the outer layer is the so-called Window Layer). Note, again, that Equation 9 is the so-called dopant weighting formula, and accounts for the larger volume of material at a larger radius in a pseudo sphere PN or PIN junction to maintain charge balance.

If the above dopant levels are within the acceptable range of impurities in the material system, as to not increase recombination or create a semi- or fully-degenerate semiconductor device, then the proper balance has been achieved and electronic considerations have been developed. Typical values for amorphous silicon are 10^17/cm^3 for N type dopant and 3*10^17/cm^3 for the P type dopant material. Note, however, that the weight formula, Equation 9 will modify this significantly if the layers have larger radii, and the relation of the P layer to the N layer (above or below). Crystalline silicon will abide by the same weighting rules, but dopant activation in that material is far easier and lighter doping is necessary. Typical values are 10^14 for N and 5*10^15 for P.

pleniron 200 spacing consideration and optimization are additional factors. The spacing of the plenirons 200 in the array 100 allows optimum lighting of the devices from or nearly all angles of incidence with minimal shadowing. Although a regular structure is necessary for this optimization, the device can be similarly irregular, and still function, albeit to a lower performance level.

Once the sizes of the layers and the underlying pleniron core 210 are known, addition may be used to determine the size of the overall pleniron 200. Then the following formulas can be used to determine the optimum spacing to achieve the best sidewall exposure of the pleniron devices at all orientations in θ and φ.

Using Equation 1, or the argument of the ArcSin function in Equation 1, and choosing an appropriate ratio for that argument, less than about one, such that the incident angle from air (or vacuum) into the transparent conductor is totally internally reflected in the absorber, an absorber thickness appropriate for the material system selected from above may be solved.

As a general rule the Transparent conductor, whether an oxide of a metal, or doped oxide, or selenide, or otherwise, must be of a thickness between about 0.67 and one times the thickness of the underlying absorber 208. Since the transparent oxide is generally a lower index of refraction than the absorber material (which allows for stepped indices as the radius decreases inward) the thickness rule is applied to prevent grazing incidence and subsequent exit into the transparent conductor and then immediately out. Although this scenario may lead to a subsequent absorption, some percentage, perhaps as high as 25%, of the light field strength is lost through a pass through the Transparent conductor full path. An alternative scenario is the acceptance into the transparent conductor followed by internal reflection, albeit imperfect or rejected acceptance into the absorber. This scenario causes a significant amount of trapped photons to be absorbed as heat only in the transparent conductor, if it is too thick proportionally.

Calling the argument to the Arcsin function in Equation 1, g, we solve for absorber thickness using 0.75*d(abs) as a substitution for the thickness of the transparent conductor in the equation for g. We obtain the following for the absorber thickness that will meet the requirement for the incident angle TIR in absorber 208.

$$d_{Abs} = (n_2 - g) R_c / (1.75 * g)$$

Note that here n2 is the index of refraction of the transparent absorber, as in Equation 1, g is the argument of the Arcsin function, $R_c$ is the radius of the underlying pleniron core 210, and the result, $d_{Abs}$ is the optimum thickness of the absorber material, including P, N, and Intrinsic semiconductor regions, as needed. Note that the parameters for the electrical junction of the device dependent on the material system selected are discussed herein. Therefore, the material system, complete with dopant activation and carrier characteristics, should support the thickness of absorber selected by the above analysis. The absorber 208 thickness should be sufficient to allow wave propagation and standing wave development within its layers to participate in optical volume and uniform density of photon states phenomena.

The optical volume effect, that is the homogeneity of photon density of states throughout the entire optical thickness of the device to whatever depth is desired and allowed by the material system, depends on wave propagation, standing wave development, and a steady state density of states in the absorber material. Therefore, the absorber material thickness should not be sized minimally such that its physical thickness is less than allowable half wavelength of light which is intended to be absorbed. This is referred to in waveguide and electromagnetic design disciplines as the Cutoff Wavelength where the minimum thickness of the propagatable material is less than a half wavelength of the light incident. Since the wavelength of interest is dependent on the band gap of the material, it may be in the ultraviolet (UV) region as the minimum, so wavelengths may be less than 300 nm. For absorber indices of refraction of 3, for instance, this requires that the absorber thickness be greater than about 50 nm, at the very least. Note that, aside from material savings, there is not significant harm in having more radial modes of propagation, as well as circumferential, than the fundamental, half wavelength. Therefore, having absorber thickness significantly greater than cutoff, such that they meet the ratio supplied by Equation 1, for g, will allow for optical efficacy and enhance, not degrade energy conversion efficiency.

Restricting the photon propagation modes, however, by operating near the cutoff wavelength, may severely limit efficiency due to the requirement that solar plane waves conform to spherical, or pseudo spherical, modes in propagation in the absorber material. This transform mathematically, from d'Alembertian plane wave propagation to spherical Hankel functions, spherical harmonics, and Legendre Polynomials, restricts the number of allowable photon modes such that at least about 63% of the wavelengths of visible light are not allowed in.

The worst case scenario, that is operating below the cutoff wavelength, allows only evanescent waves within the absorber 208. Although the sub-wavelength propagation concept is of interesting research in optical waveguides, it is of little use in photovoltaics. Evanescent waves carry no energy and cannot convert their effectively zero power Poynting vector into any excitons. Any presumed superposition of evanescent waves in myriad sub-wavelength structures have not been shown to produce any power of any meaningful value. This brackets the size of the absorber 208 layer, considering the minimum, or the cutoff wavelength value, and the maximum, being that driven by the g value, and design tempered by electronic selection considering screening length and ultimate $V_{oc}$ production. Recall that the requirement that the P-N or PIN structure must be fully depleted for this to function completely according to design parameters.

Spacing of the pleniron 200 elements in a regular array, or the average spacing, if controlled, in an irregular array, can be optimized such that the plenirons 200 are not obstructing or shadowing each other over the widest possible range of incident angles. This will allow an untracked solar array 110 of plenirons, in a plenistell module, to produce the maximum amount of power when angles are not normally incident. Because the optical volume, and TIR, characteristics of the array 110 allow far higher power production at more oblique angles of incidence than planar devices, up to about 2× to about 2.5× integrated power over a full daytime can be achieved. The meta-material plenistell array will not obey the sinusoidal Cos[θ] decrease from normal incidence like a planar array. Although the array 110 still would make the maximum amount of power from normal incidence, thereby maximizing the potential from the largest subtended area, its power production capability will be a much less subtended-area-related function of angle.

Since, depending on the level of embedding of the pleniron core 210 in an underlying substrate, the radius of the finished pleniron 200 is similar to its height, calculations of the optimum spacing can determine the shadowing efficacy of the finished radius as well. If the plenirons 200 are arranged in a regular lattice-type structure in two dimensions on an underlying substrate, their arrangement is determined by a so-called basis set. The basis set has two fundamental parameters that determine the location of the centers of each of the plenirons 200 across the entire array 110. A simple example would be a rectangular array, and a slightly more complex example would be a hexagonal or trigonal array.

Using Wolfram Research Mathematica notation as a mathematical method for reporting analysis, the following is an example of a very generalized mathematical basis set for any two dimensional array of objects:

a1V[a_,b_,c1x_,c1y_]:={a*c1x, b*c1y};
a2V[a_,b_,c2x_,c2y_]:={a*c2x,b*c2y};

Here a and b are constants and the c1x, c2x, c1y, c2y are the vector components of the basis unit vectors that describe the directions, to be multiplied by the a or b constants, to obtain the regularized spacing.

The following is then utilized to create a regular array in a virtual mathematical environment for visualization and analysis of light obstruction on the devices:

basisSetSphere[xM_yM_,a1,b1_,c1x1_,c1y1_,c2x1_,
    c2y1_,h1_]:=Flatten[Table[{Append[x*a1V[a1,b1,
    c1x1,c1y1]+y*a2V[a1,b1,c2x1,c2y1],h1]},{x,-xM,
    xM},{y,-yM,yM}],1]

Note that in this example the h1 variable is the same as the radius of the average pleniron device and the xM, yM are merely the maximum size of the display of the device array. The Mathematica code necessary to manipulate the finished array is as follows:

sphBasisManipulate1=Manipulate[sphBasisArray[10,10,
    q,q,1,0,0.5,0.866025,h,r,x,y,z], {{q,6,"Spacing (CTC)
    "},4,20,Appearance
    "Labeled"), {fh, 10, "Plen Rad"},4,20, Appearance
    "Labeled"), {{r, 2, "Plen Rad"},1,5, Appearance
    "Labeled"), {{x, Pi/4, "x
    Angle"}, −Pi/2, Pi/2, Appearance
    "Labeled"), {{y, Pi/4, "y
    Angle"}, −Pi/2, Pi/2, Appearance
    "Labeled"}, ({z, Pi/2, "z−Angle"},0,2Pi, Appearance
    "Labeled"), FrameLabel
    "Plen Parameter Manipulator", ControlPlacement
    {Top, Top, Top, Bottom, Bottom, Bottom}]

Figure 22:
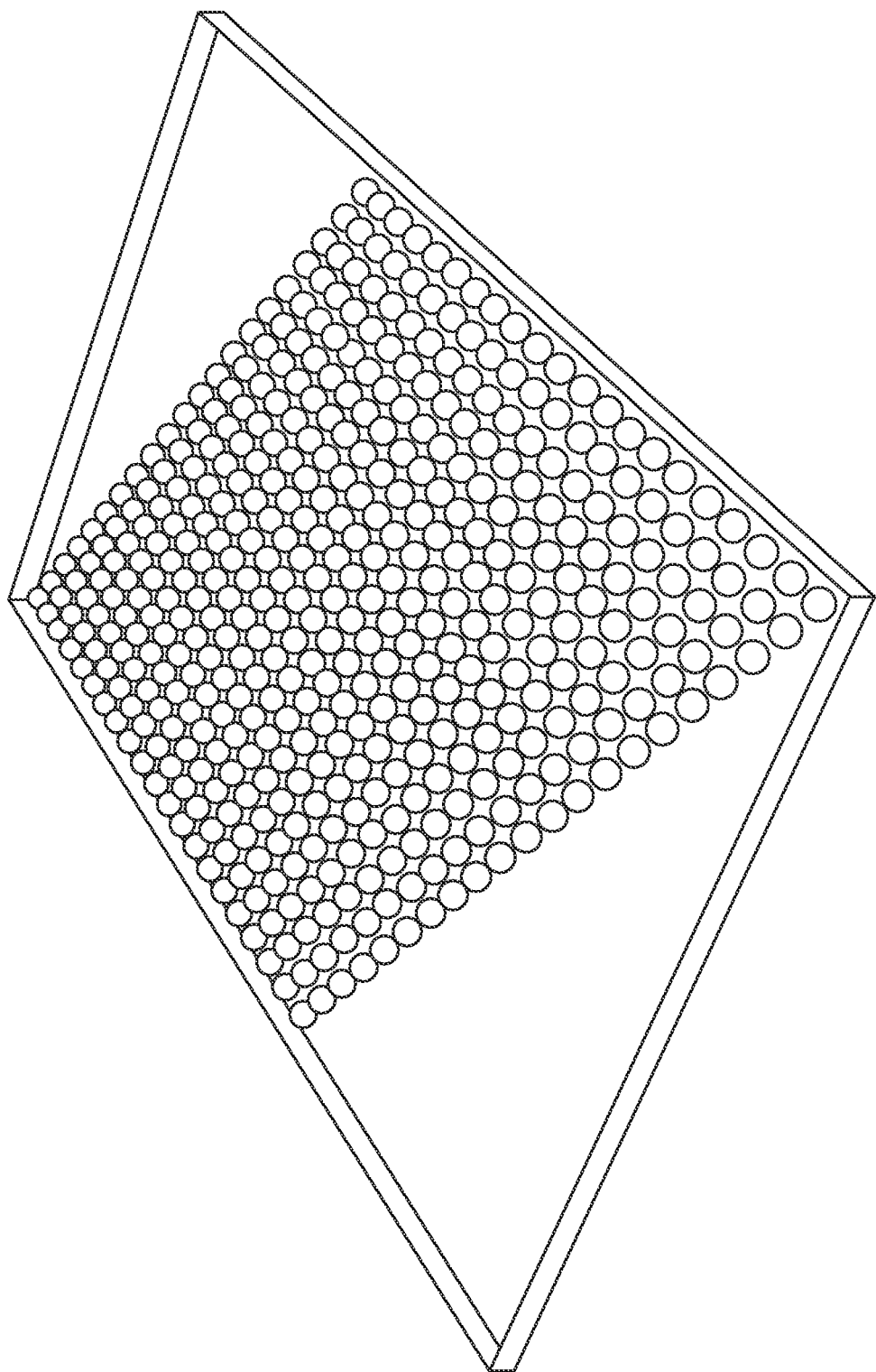
FIG. 22 is a diagram of an example array of plenirons having an arrangement of the plenirons with defined coordinates wherein the plenirons are not shadowing each other over a widest possible range of incident angles of light rays from the sun in accordance with one or more embodiments.
Figure 23:
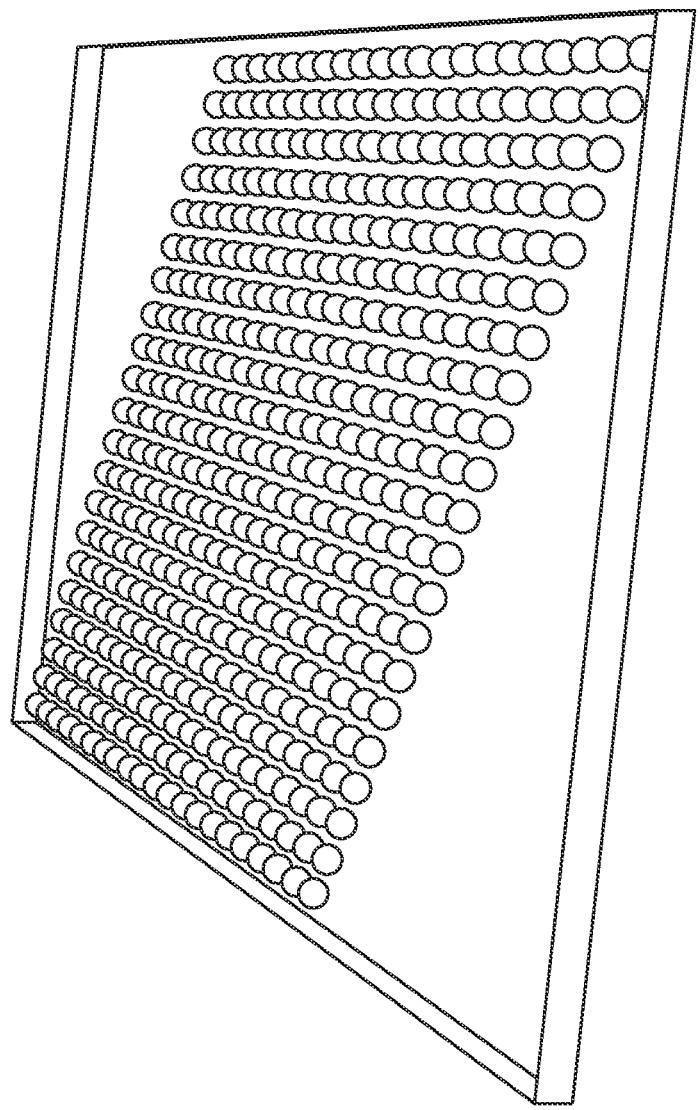
FIG. 23 is a diagram of an example array of plenirons taken at an extreme angle as would be viewable from the viewpoint of the sun at an extreme evening or early morning position in accordance with one or more embodiments.
Figure 24:
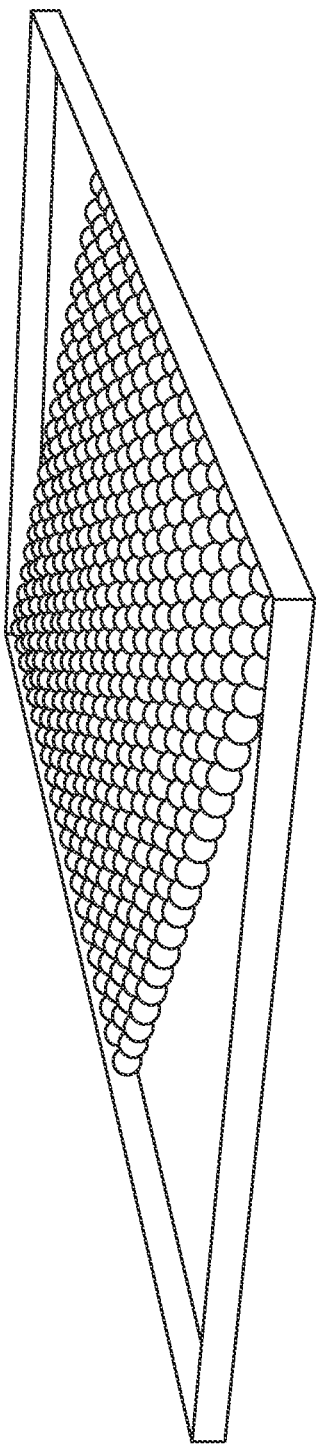
FIG. 24 is an array of plenirons at the same extreme angle as the array of FIG. 23 but with the $\varphi$ angle rotated by $\pi/6$ radians in accordance with one or more embodiments.

This results in the array 110 as shown in FIG. 22 from the defined coordinates. The spacing, size, and orientation of the plenirons 200 are factors to maximize the off-angle performance of the device over an entire daytime. As an example the array 110 of FIG. 23 is taken at an extreme angle, as would be viewable from the sun's viewpoint at an extreme evening or early morning position. Note that, at this extreme angle all of the plenirons may be obstructing each other, although not as much degradation would be apparent as with a planar array. One should also note that the rotational angle, φ, from nearest neighbor to nearest neighbor vector, causes the most obstruction. The array 110 of FIG. 24 is an example of the same extreme angle but with the φ rotated, in this trigonal example, by π/6 radians.

To prevent the obstruction of the plenirons 200, allow the maximum Optical Volume to be evident, and allow the transmission curves of FIG. 21 to be optimized, the outer edges of the plenirons 200 may be occluded by only that amount, about 0.8 to about 0.9, that is expected to significantly reflect and not absorb. This factor, the occlusion, referred to here as γ, can be a double check on the radius of the completed pleniron 200, and thus its height, in the following way. Once the device diameter is known from the calculations above from Equation 1, the exposure ratio, γ, is used to determine the optimum pitch, or center to center spacing of the devices. This gives, as the pitch, a, the following:

$$a = (1+\gamma)D_d$$

where $D_d$ is the finished pleniron 200 device diameter. This can then be used in conjunction with the prior calculations for the device diameter to allow total internal reflection to determine all of the other parameters for the optimum pleniron 200, and their subsequent spacing into arrays 110.

If the pleniron's 200 basis set is such that it is a trigonal approach, for example, the following would be an example of how the distance between second neighbors, those opposed across basis vectors in a long orientation, would be calculated:

$$a_L = 2\sqrt{3}(1+\gamma)R_L[1+(n_2-g)R_c]$$

Note that n2 is the index of refraction of transparent conductor, g is the ration defined by the argument of Equation 1, and Re is the radius of the inner core 210 of the pleniron 200.

If the plenistell 200 is untracked, relative to planar, not only will the instantaneous power be nearly about two, or more times that of planar, but the integrated power over a daytime will be about 2× to about 2.5×. However, if it is tracked, in an equatorial fashion, the instantaneous power generated can be integrated over the daytime, modulated by the solar spectrum power reduction at extreme angles due to atmospheric scattering, e.g., Air Mass 1.5 standard from the National Renewable Energy Laboratory (NREL).

Power output can be maximized through the use of algorithms that maximize the exposure relative to the sun as a point source, minimize pleniron 200 shadowing and attempt to expose the largest possible surface area of the array 110 in the long orientation, as opposed to the short. Note that this is illustrated in FIG. 22 through FIG. 24.

Using trigonometric analysis for the angles of occlusion of the plenirons 200, the following transcendental equation is developed that relates the azimuthal angle of incidence (Phi–x in this example), and the altitude angle of incidence, Theta–y in this example, to the angle of exposure, gamma. The equation to be solved is the following, for partial hemispheres obstructing each other with changes in incident Phi and Theta:

$$\gamma = \text{Solve}\left[\frac{a\tan(y)}{r} - \cos(x)\tan(y) + \sin(x)\right]$$

The relevant solutions to the equation are as follows, performed using Wolfram Research Mathematica:

$$x \to -\cos^{-1}\left(\frac{-2\sqrt{-a^2r^2\sin^2(y)\cos^2(y) + 2ar^3\sin(y)\cos^3(y) + r^4\sin^2(y)\cos^2(y)} - ar\cos(2y) + ar + r^2(-\sin(2y))}{2r^2}\right)$$

In addition, the following solution is relevant as well, although for a separate section of the Phi angle:

$$x \to \cos^{-1}\left(\frac{2\sqrt{-a^2r^2\sin^2(y)\cos^2(y) + 2ar^3\sin(y)\cos^3(y) + r^4\sin^2(y)\cos^2(y)} - ar\cos(2y) + ar + r^2(-\sin(2y))}{2r^2}\right)$$

These solutions as shown in FIG. 24 relate the Phi to the Theta and produce a surface of energy production with the vertical axis being watts and the two horizontal axes being the theta and the Phi respectively. Note that the x-axis, which ranges from 0 to Pi radians (3.14) represents the moving of the Phi angle, at a fixed Theta, over 180 degrees of orientation. This is equivalent to moving the device in Phi from the long to short to long orientations 3 times respectively.

One example of the manufacture and process of this array 110 of plenirons 200 is using Polycrystalline silicon deposition on top of a pleniron core 210 of monocrystalline silicon. Adhering to the parameters of the ratio of Equation 1 and the subsequent parameters delineated herein, the polycrystalline layer will be of a certain required thickness, sufficient to fully deplete the pleniron core 210, and be depleted itself, such that electron and hole distributions are distinct. This is accomplished with Physical Vapor Deposition (PVD), whether RF amplified, biased, or otherwise, or via Chemical Vapor Deposition (CVD), using usual methods such as sub-epitaxial processes with organic precursors or inorganics (e.g., Silane, trichlorosilane, dichlorosilane, disilane, TEOS, etc.).

The pleniron cores 210 may be embedded into an underlying substrate 212 using a technique where they are created in a pseudo-spherical fashion prior to their utilization, embedded into a polymeric material to the desired depth, followed by electrodeposition or sputtering of metal over the exposed surfaces. If the pleniron core 210 is embedded to somewhat less than ½ of its diameter in the polymer material, the metallic deposition will cover greater than ½ of the surface area of the exposed surfaces. This is then regarded as the back contact material 214, that either exhibits ohmic contact with the semiconductor pleniron core 210 or a positively facing (current from semiconductor to metal) advantageous Schottky junction that will act as a heterojunction in combination with the PN or PIN junction of the device.

Another embodiment of the pleniron 200 based array that will also exhibit optical volume properties to the extent allowable by the material system may comprise a conductive pleniron 200, for example using a polysilicon, metallic, an so on, pseudo-spherical pleniron core 210 that would then have PN, PIN or Schottky diode type charge displacement properties. This films of the P, I (if needed) and N materials would then be deposited over the micro- or nano-structured back contact substrate. Of course, the substrate would consist of either conductor-based pleniron cores 210, embedded in metallic materials, or a degenerate semiconductor material, or an insulator (of polymer or inorganic type) that is structured and then metalized by an appropriate method, electroless metal, electrodeposition, or conformal PVD/Sputtering methodologies.

In the cases above, either with a semiconductor pleniron core 210, or with a degenerate or conductor-based pleniron core 210 underlying the device, the layers of absorber could be deposited over the metallization, whether in PN, NP or PIN/NIP configuration, using depending on the material system, Chemical Vapor Deposition (CVD), Plasma-Enhanced Chemical Vapor Deposition (PECVD), Physical Vapor Deposition (PVD) which includes sputtering techniques, and/or Atomic Layer Deposition (ALD). In addition, it is considered viable to deposit nano-grained N or P type semiconductor materials, of any variety, using Electrophoretic Deposition, EPD. Various methodologies have differing advantages with regard to cost, throughput, surface roughness, bulk material quality, and/or contamination risk.

In each case, whether the material system is crystalline, polycrystalline, nano-crystalline, or amorphous, the layers are doped, or seeded with charge carriers, by adding appropriate small quantities of donor or acceptor materials, tuned for the material system electronically, to the layers, during deposition, whether for P or N types. Intrinsic regions, if needed, may be left undoped or just lightly doped. The appropriate doping levels are dependent on the material system, as discussed herein, and selected to be optimum to fully deplete the various radially displaced layers of their charge carriers in an equilibrium state, no bias. Note that, as discussed herein, the doping should be weighted, or adjusted, due to the radial nature of the junction. This is because there is greater volume in the outer lying regions, due to the pseudo-spherical shape, and that greater volume needs fewer charge carriers, doping, per unit volume to obtain the same total number of carriers to support the junction depletion.

Noting the doping levels of the P and N regions respectively, in the current example of silicon, either Arsenic (Ar), Phosphorus (P), or Antimony (Sb), for the N regions, and Boron (B) for the P regions. While there are other N and P dopants, they are not typically as effective in their doping capability due to higher activation energies, EA, or crystalline defect producing effects in crystalline or poly/nanocrystalline materials. If the material selection is monocrystalline for the pleniron 200 then the wide array of selection of dopants and the case of production incentivize the selection of silicon as the base material. Naturally a PN junction is created through the application of epitaxial or ALD applied P and N silicon. High quality nano-crystalline material can be used in a PN junction if the interaction at the metallurgical junction is diffusion-limited and the interface does not exceed about 50 Angstroms. Any increase in the diffusion across the metallurgical junction of the P and N junctions will cause depreciation of the electrical properties of the device such as $V_{oc}$ and shunt resistance $R_{Shunt}$, and may severely limit performance exponentially with diffusion distance.

The upper levels of the pleniron 200 are to be made up of a transparent conducting material as the so-called top contact. This contact is the window layer, which allows light to complete the optical volume effect using the ratio from Equation 1, allows it to enter the pleniron 200, and allows a conductive material with which to carry current in the form of electrons or holes, depending on the direction of the junction created. This material can take the form of any conducting material that is reasonably transparent, such that its absorption coefficient, typically, $\alpha$, that comes out of the extinction coefficient, k, from the complex portion of the dielectric constant, $\epsilon$. Examples of this are doped Zinc Oxide, ZnO, with Aluminum (Al), or Boron (B), or a variety of other conductive dopants. The mix of amorphous and crystalline materials, with dopant, can be applied with Physical Vapor Deposition (PVD), whether radio-frequency (RF) biased or direct current (dc), or by Chemical Vapor Deposition (CVD), or with Atomic Layer Deposition (ALD). The smoothest layers for the roughness parameters may be achievable with the more conformal methods, especially ALD.

Other materials for use as a conductive transparent material may include Indium Tin Oxide, ITO, doped Tin Oxide, B:SnO2, doped Nitrides, doped silicon oxy-nitrides. However, it should be noted that engineering design criteria is such that, although only one pass of light through the transparent conductor 218 is involved, some materials, such as ITO, although highly conductive, are not especially transmissive over significant distances. As noted in earlier sections involving the geometry of the devices ITO would be conducive to pleniron cores 210 of smaller diameter, such as might be used with materials with higher extinction coefficients than silicon, whether crystalline or otherwise.

Encapsulation as the final possible step in the production of an array 110 may involve the use of a polymer material. This polymer material can be any transparent, limited absorption coefficient material, such as ethylene vinyl acetate (EVA), or polyimides or otherwise. In addition, encapsulation might occur automatically as a result of a superstrate rather than a substrate construction, where a transparent material is structured first and the subsequent layers, including semiconductor junctions and transparent conductors, are added in the order appropriate. This makes implicit that the pleniron structures will be surrounded by a material more optically dense than air. Although the device will perform differently as a function of the angle of incidence, there will be less dependence on the geometry. The dependence of the geometry will be in accordance with, again, the parameters of Equation 1 in the beginning of this document.

Other embodiments of semiconductor absorber 208 materials might be Gallium arsenide, GaAs, Cadmium Telluride, CdTe, Gallium Nitride, GaN, CIGS, Cadmium Indium Gallium Selenide, or other binary or tertiary semiconductor combination. Amorphous materials may include amorphous silicon or lead or bismuth compounds or combinations thereof. These might involve either a PN junction or a PIN junction depending on the above.

The creation of the pleniron core 210 may be performed by perforating substrates 212, micronizing them, and polishing them electro-hydrodynamically to achieve the desired shapes while retaining the necessary bulk material properties. It should be noted, however, that the scope of the claimed subject matter is not limited in this respect.

Although the claimed subject matter has been described with a certain degree of particularity, it should be recognized that elements thereof may be altered by persons skilled in the art without departing from the spirit and/or scope of claimed subject matter. It is believed that the subject matter pertaining a photovoltaic device and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

In another embodiment, the plenistell, and even an individual pleniron, can act as any of a broad range of types of optical sensor because each is a photovoltaic device in and of itself. Utilizing the plenistell in this fashion in some examples involves a number of plenirons in an array as deemed necessary by a manufacturer or end-user. A photovoltaic device is defined as one that generates electrical current from an applied voltage and excitation by light. Therefore, the plenistell, set of plenirons, or even a single pleniron, can be utilized, for example when calibrated, to determine or sense a number of photons, or other variables of impingent light, given the appropriate remaining unknowns. The number of photons, for example, can be determined from a measured electrical current generated, given illumination by a small spectral bandwidth source such as a laser.

Provided the layout of an array of plenirons in a given plenistell, as provided in the above discourse regarding basis sets as discussed herein, a plenistell can determine the angle of incidence within a range of angles of periodicity. Because of the regular spacing of an array of plenirons in this embodiment, a given pleniron can occlude the light incident on one of its nearest neighbor and followed by a second-order neighbor differentially as the incident azimuthal and altitudinal angle is changed. As further example, a rectangular array of plenirons in a plenistell, of design-intended extent, can produce a unique current or power signature over a 90 degree azimuthal range and an approximately 60-70 degree altitudinal range. Note that this effect can be present and detectable with white light of a fixed radiance. Note that this was discussed above and as shown in FIG. 24.

Referring to the aspect of the discussion herein, where prior material led to design criteria for the regular spacing of plenirons in a plenistell array, portions of the derivation of the following matter in that discourse are provided herein as examples of algorithmic development to extract plenistell optical information. For example, as further introduced above, the design criteria for spacing of a regular array come from optical, electronic, and other fundamental material considerations. To prevent over "shadowing" of plenirons in an array that has been too packed, or not having them close enough together to avoid "floor" (or substrate) or glancing-angle pleniron reflections in either Sigma or Pi types of polarization, optimal signal production algorithms, for the widest possible input angle range as possible, have been developed as described herein. To this end, to lead to equations shown herein which then form the transcendental equation below:

$$\gamma = \text{Solve} \left[ \frac{a\tan(\phi)}{r} - \cos(\phi)\tan(\phi) + \sin(\theta) \right] \quad \text{Eqn. C1}$$

These equations subsequently lead to the solutions shown in that same section above. It should be stressed in reminder that $\gamma$ is a complicated section of solid angle that is a function of angles $\theta$ and $\phi$, transferred by symmetry to the center of a given pleniron, to provide the area of a neighbor pleniron not shadowed by the first and thus illuminated by light incident from all $\theta$'s and $\phi$'s included. The equation provided herein, which includes pleniron information such as core radius and indices of refraction, was obtained by including Transmission coefficients, the probability of transmitting into the pleniron as opposed to reflecting off as a function of angle, for both the Sigma and Pi polarizations of light. That equation is re-presented below:

$$a_L = 2\sqrt{3}(1+\gamma_{max})R_L[1+(n_2-g)R_c] \quad \text{Eqn. C2}$$

Here, $\gamma_{max}$ is clarified to mean an integration of $\gamma$ over $\theta$ and $\phi$. Note, also, that this equation includes geometrical considerations of the plenirons such as core radius and indices of refraction. Optimizations of these factors can, again, be provided by elaboration of Eqn. 1 herein.

Figure 26:
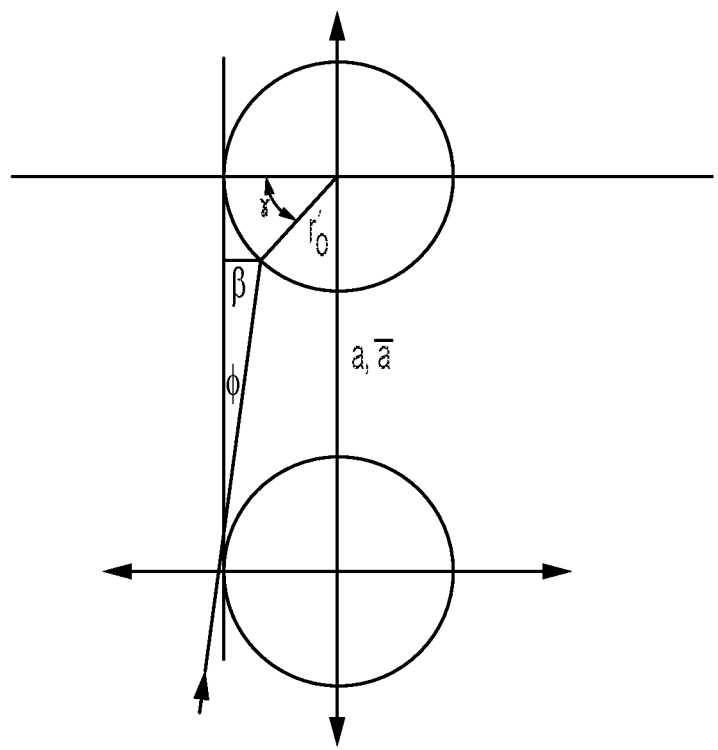
FIG. 26 is a diagram showing geometrical and differential analysis of shadowing angles for the angle $\phi$ in accordance with one or more embodiments.
Figure 27:
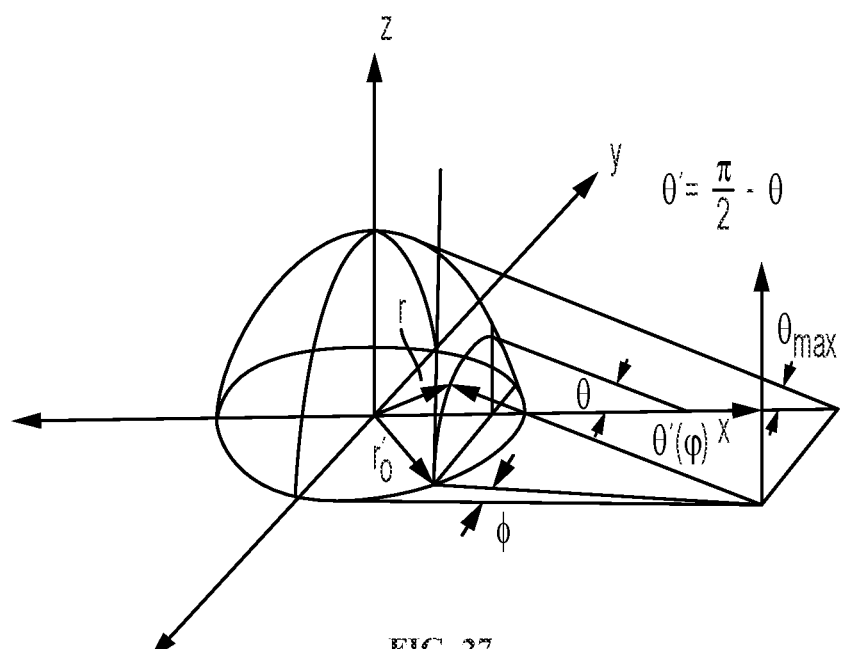
FIG. 27 is a diagram showing geometrical and differential analysis of shadowing for the angles $\theta$ and $\phi$ in accordance with one or more embodiments.

In addition, geometrical and differential analysis of shadowing angles, as is shown in FIG. 26 for the angle $\theta$, and in FIG. 27 for the angles $\theta$ and $\phi$, has provided, for hemispherical plenirons, the following representation of the angle $\theta$ as a function of $\phi$, $\theta(\phi)$:

$$\theta(\phi) = \cos^{-1}\left[ \frac{(a - r_0\sin\phi)}{\sqrt{(r_0^2 + (a - r_0\sin\phi)^2)\cos\phi}} \right] \quad \text{Eqn. C3}$$

Figure 28A:
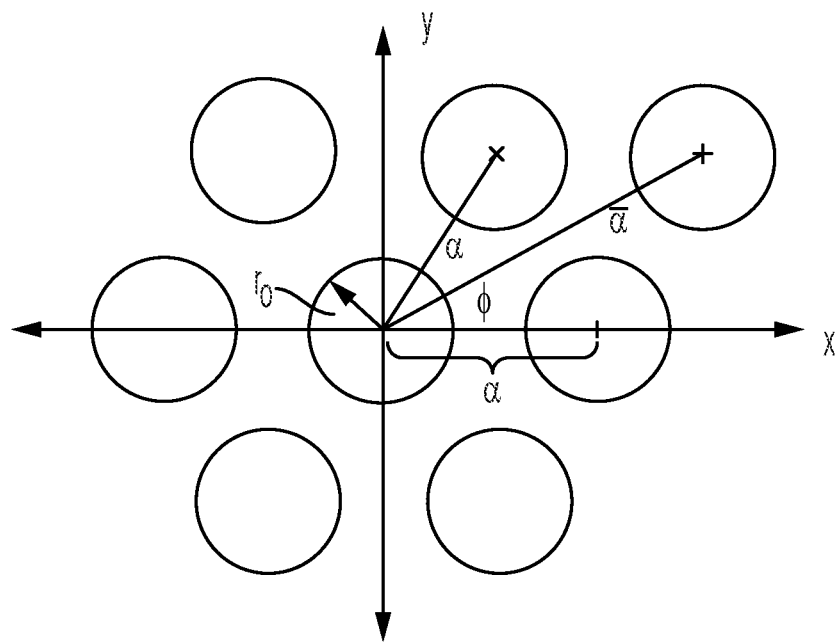
FIG. 28A is a diagram clarifying the nearest neighbor distance, a, in the same top view, and also showing $\bar{a}$ for a hexagonal pleniron array type in accordance with one or more embodiments.
Figure 28B:
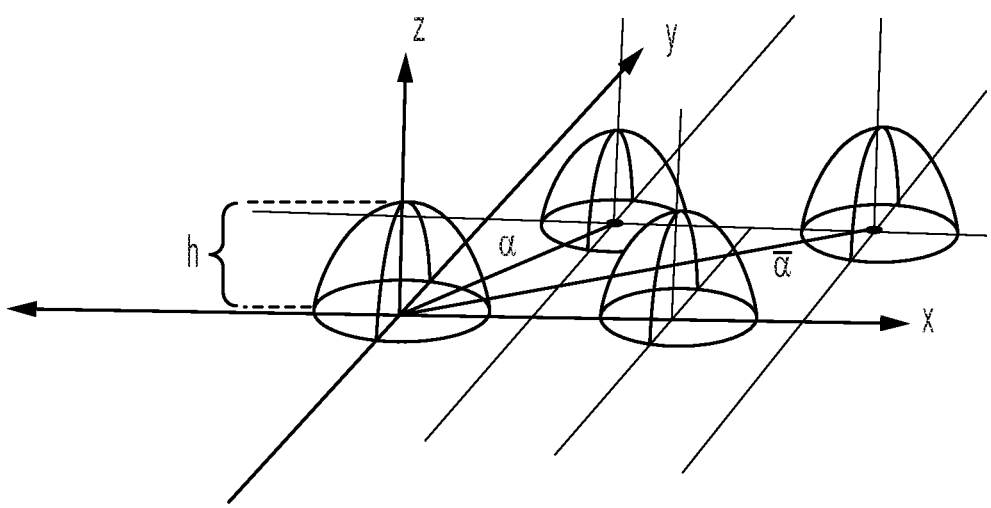
FIG. 28B is a diagram showing the coordinate formalism for the angle $\phi$ in an isometric view and including the plenirons as wireframes of their outer shell in accordance with one or more embodiments.
Figure 29A:
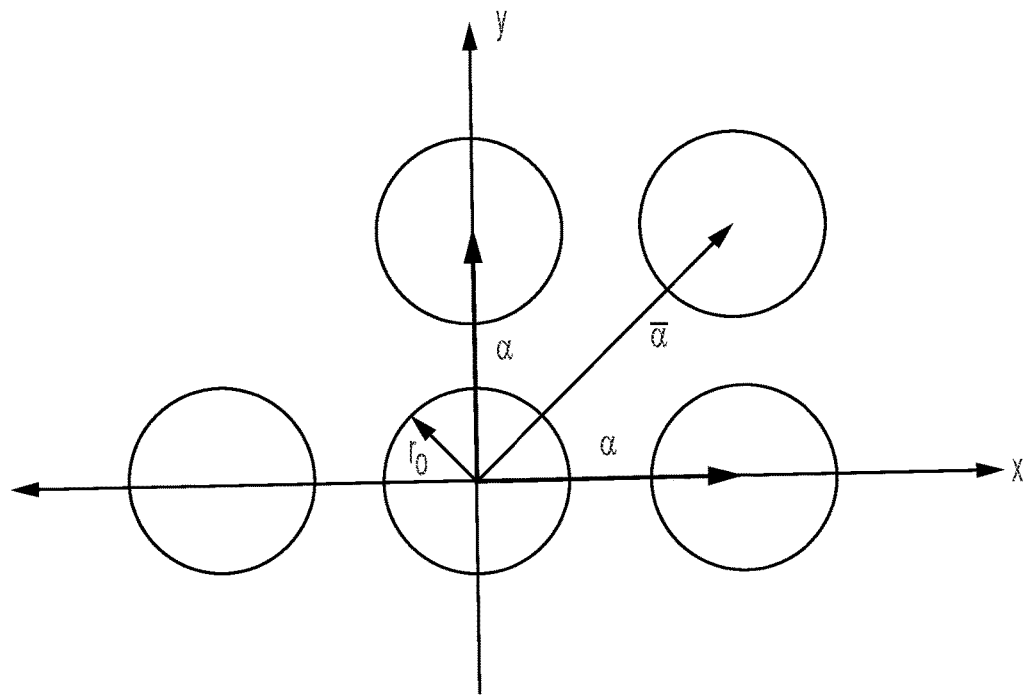
FIGS. 29A and 29B are diagrams illustrating the subject matter of FIG. 28A and FIG. 28B for a rectangular pleniron lattice arrangement n accordance with one or more embodiments.
Figure 29B:
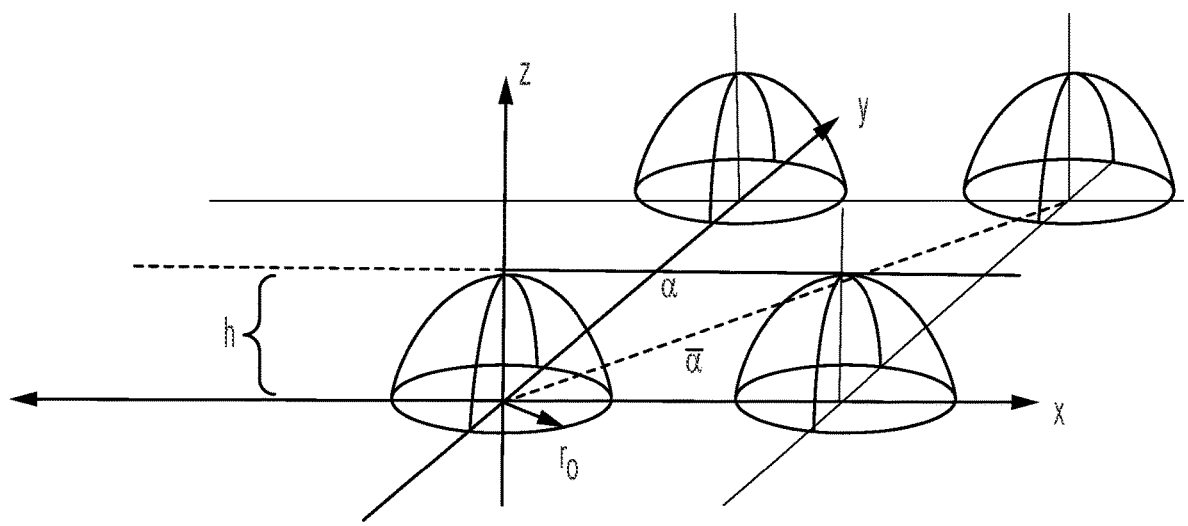

Note that in FIG. 26 the constant $r_0'$ represents the radius of the base of a repeated pleniron as this figure is a top view (from +z looking in -z direction). Here, the constant a is the center-to-center pleniron spacing specifically in the "short" neighbor direction. The constant a represents the "long neighbor" center-to-center distance represented as $a_L$ in Eqn. C2. FIG. 28A clarifies the nearest neighbor distance, a, in the same top view, and also shows a for a hexagonal pleniron array type. It also, notably, shows the coordinate formalism for the angle $\phi$ (absolute coordinates—where a selected pleniron center point is chosen as the origin and the unit cell is repeated in accordance with the lattice vectors discussed herein). FIG. 28B shows the same in an isometric view for clarity, although it includes the plenirons as wireframes of their outer shell. The height, h, of the pleniron is shown here as well. FIG. 29A and FIG. 29B show the same, respectively, for a rectangular pleniron lattice arrangement.

Figure 25:
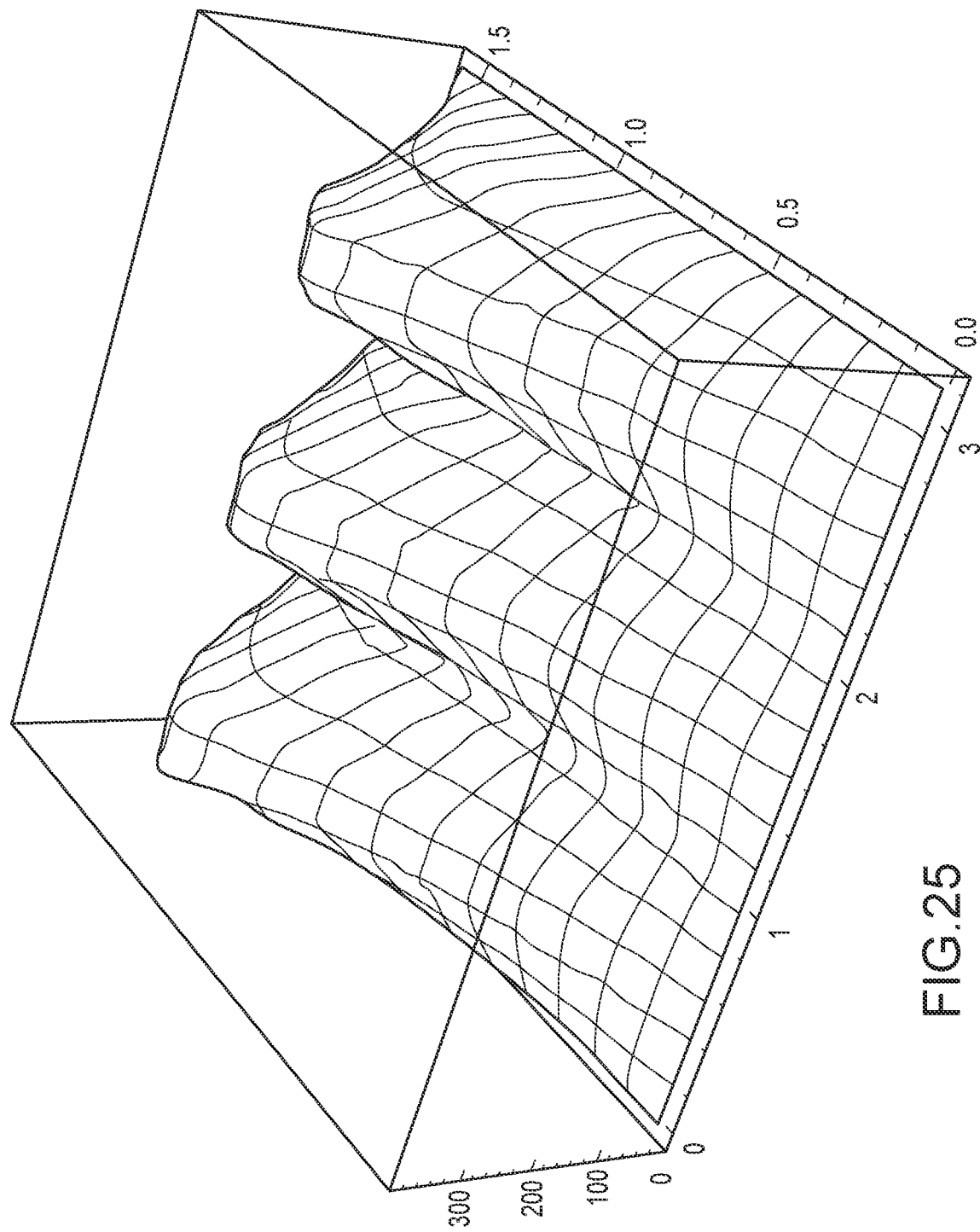
FIG. 25 is a plot of a solution for the power output of an example array of plenirons relating the Phi to the Theta with the vertical axis being power in watts and the two horizontal axes being the Theta and the Phi, respectively, in accordance with one or more embodiments.

FIG. 27 brings special note in that it shows, as in FIG. 26 from a top view, the angle $\phi$ shifted by symmetry for clarity to a position off the edge of a "shadowing" pleniron onto the subject. Recall that $\phi$ is the angle (azimuthal from 0 to 2 Pi radians) from a line drawn through the centers of the bases of a nearest neighbor, a, plenirons. At $\phi$=0, for example, at $\theta$=0 (in plane of substrate view) all the plenirons would be completely shadowed by the ones in front of them. Any slight angle, even, off of $\phi$=0 would allow some incident light illumination of the plenirons behind. Including $\theta$, as shown in the figure, which is a function here of $\phi$, provides a compound angle onto the subject pleniron. The vector r, from the center of the subject pleniron, shows the shadow line demarcation of the base edge of the shadowing pleniron as $\theta$ and $\phi$ change progressively. As the line shown is that progression of the two angles from just one point on the shadowing pleniron surface, an integration over the shape of the shadowing pleniron in $\theta$ and $\phi$ transferred to the subject surface ultimately results in an energy surface as provided herein and FIG. 25. This surface is shown for $\theta$ varying between 0 and $$\frac{\pi}{2}$$

and for $\phi$ from 0 to $\pi$ (although it is repetitive in the symmetry of the array layout—e.g., hexagonal lattices will have $\phi$ variations every 60 degrees and rectangular only every 90).

Note that part of the above discourse, as example, and for simplicity, was for hemispherical plenirons. As has been noted herein, any pleniron need not be hemispherical but can adhere, for design optimization, to the criteria set forth. Non-hemispherical plenirons will still work for either the prior patent (as noted previously), or in the current content, by adhering to the rules of design such as the Grand Ratio for cross-sections of a given device. Therefore, if other shapes, such as inverted paraboloids, partial solid ovals, gaussians, or other repeated distribution, adhere, in most or all of its cross-sections, to the design rules specified, then it will be optimized as described. An example of a Gaussian-type of pleniron that may meet, depending on the material system, optimization is shown in and described with respect to FIG. 33 below.

The above described effect, from a simple arrangement of plenirons in a plenistell of arbitrary extent, can provide more detailed information if the source is coherent and monochromatic, for example per the discussion herein. Laser illumination can allow an array to detect power or current variations from changes in the orientation of the polarization of the fields. It should be noted, however, that the detection of the polarization vector can also be modulated by the azimuthal and altitudinal effects indicated herein. The sensitivity to the polarization comes naturally from the regular arrangement of plenirons and because that arrangement does not vary in the Z direction. Thus, E-fields oscillating with a component parallel to the Z axis can interact with structure sidewall edges differently than fields with components parallel with the substrate plane.

It should be noted, for instance from the discussion herein, that a pleniron, and particularly an array of plenirons in a plenistell, is a volumetric light capturing device. This is illustrated by example in FIG. 30A where, if a femtosecond-range pulse of light is impingent, a $\Delta t_{\gamma 1}$ is the "time-lag" represented by a packet of photons penetrating on the "top" of a pleniron versus the signal generated from a packet that enters the pleniron "base" (near the substrate).

Figure 30A:
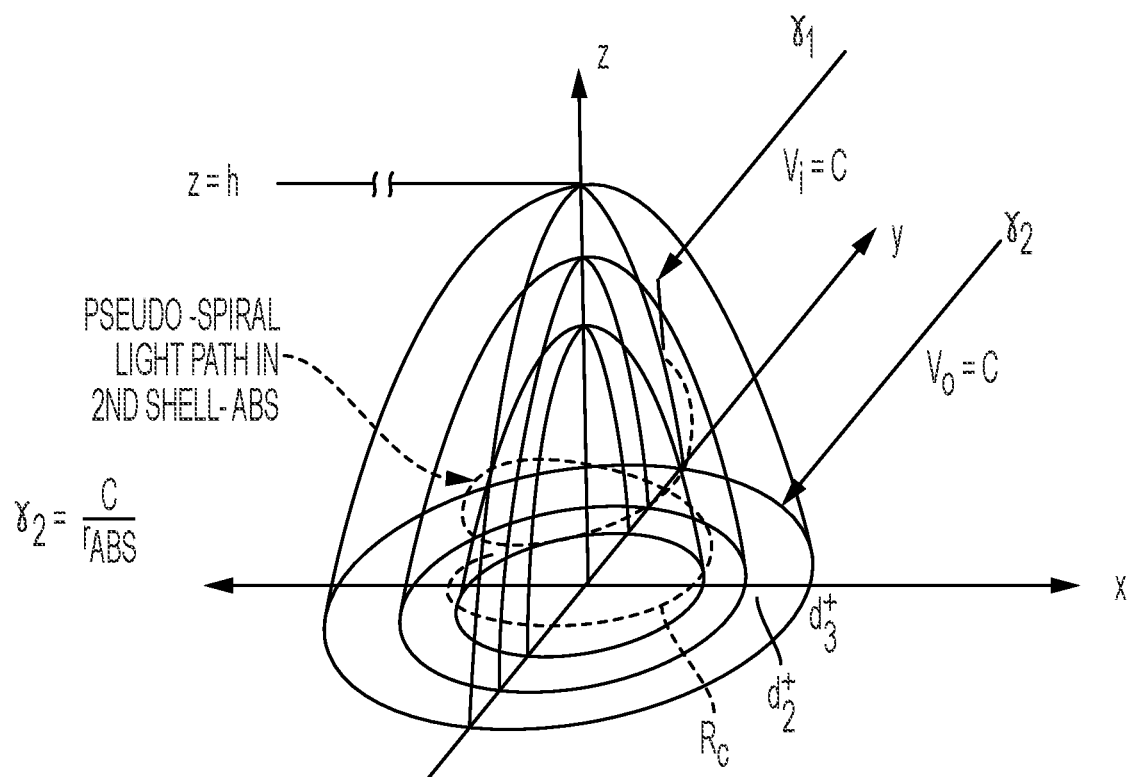
FIG. 30A is a diagram of an isometric wireframe view of two separate photon packets in accordance with one or more embodiments.
Figure 30B:
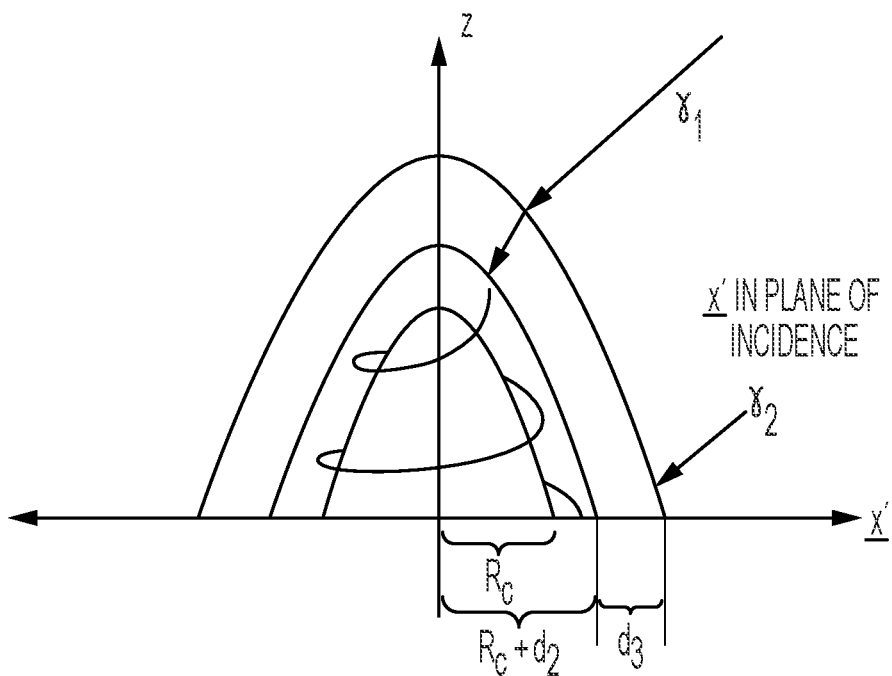
FIG. 30B is a diagram illustrating a cross-section in the plane of incidence of light rays in accordance with one or more embodiments.

FIG. 30A is an isometric wireframe view of two separate photon packets, $\gamma_1$ and $\gamma_2$, where one packet intersects, with the ray as shown, the outer transparent conductor contact near the pleniron top, while the latter intersects the surface near the base. Note that in this figure the base dimensions of the pleniron layer dimensions ($R_C$, $d_2$, $d_3$) are shown to better indicate the optically dense "absorber" layer immediately over $R_C$ with thickness (at the base) $d_2$. Note that $\gamma_1$ proceeds outside of the structure at first at speed $v_1=c$ (speed of light in vacuum) but then slows in the transparent conductor with the refracted ray shown. $\gamma_1$ further advances upon near certain probability of acceptance into the optically dense absorber layer (with index of refraction $n_2$). In FIG. 30A the path taken in the absorber is shown as a helical "spiral" which represents the average path taken by the Poynting vector of the photon ensemble as it is wave-guided towards the bottom. Note that the figure indicates that the speed of the light in the absorber material will be $c/n_2$, and thus much slower than c. Therefore, the path taken by $\gamma_1$, due to the lengthy waveguide path, exacerbated by the medium's high refractive index, means that there is a very significant time different between signals detected at the base from packets of photons impinging on the top versus those on the bottom. FIG. 30B, also representing this situation, albeit in 2D (from the side), is a cross-section in the plane of incidence of the light rays $\gamma_1$ and $\gamma_2$, which is shown as x'.

This variation occurs because, when viewed from a small photon ensemble, or single photon, perspective, any light that enters first will be "waveguided" by the high index of refraction semiconductor, which slows that light prior to absorption. Because of the time differential from either single, interval, or periodic pulses, the device retains a history of these time-domain variations. Similarly, since the device is 3-dimensional, light between structures is not attenuated, but begins to be so upon entry into a structure. These factors allow a 3-dimensional device such as this to retain real 3-dimensional information from varying light sources.

The retention of time-domain information about light variations through the optical depth of the device allows especially a regular array plenistell to capture and relay, in an informationally meaningful fashion, 4-dimensional data. This is because, in part, any light incident on the regular array from an azimuthal and altitudinal compound angle can have a decodable additional periodic variation due to a pulse wavefront impinging on the "bottom" part in Z before the "top" part of the pulse impinges. Here, h is the pulse "height", c is the speed of light in a vacuum, t is the time lag, and θ is the compound angle of incidence. The angle is deemed compound here since the situation represented here obeys the aforementioned effects of spacing periodicity as discussed herein.

For purposes of nomenclature, it will be noted that an array of plenirons, in a plenistell, as described herein can be referred to as a "Block" action sensor. This naming in no way diminishes or limits its capability, but only allows its unique features to be distinguished from other aspects in the foregoing description.

Figure 31:
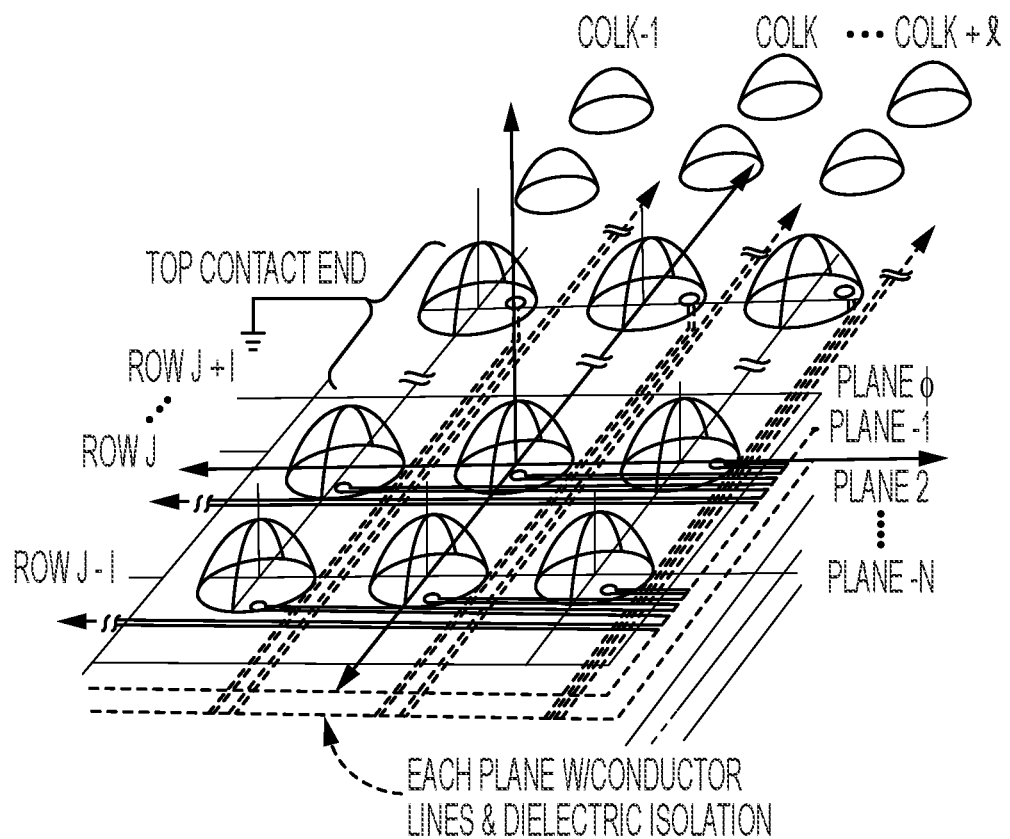
FIG. 31 is a diagram of a plenistell array made such that each pleniron is individually addressed with a matrix of vias and lateral conductor lines in separate electrically isolated lines in accordance with one or more embodiments.

In another embodiment, further information can be obtained from a regular array, if, as shown in FIG. 31, a plenistell array is made such that each pleniron is individually "addressed" with a matrix of vias and lateral conductor lines in separate electrically isolated lines in X and Y respectively. Note that the example in FIG. 31 is referred to as Direct Addressing, where each individual device has its own conducting line where a circuit is completed, as shown, to a common ground. On any device, whether digital or otherwise, the number of conducting lines of an m×n integer number array necessary can be m*n. This is ordinarily considered to be an excessive measure and misuse of valuable space within or under a device. This has led to various schemes being developed that only require m+n lines. Note that FIG. 31 shows rows and columns as indexed J and K, respectively, since this makes them distinct, in rows and columns from the underlying conductors labeled M and N. Direct addressing is one methodology by which a matrixed device can provide data fast enough to measure the changes in light configuration from plenirons over a plenistell in real time. Since a pleniron, however, is not a digital device, and an array thereof is capable of encapsulating an enormous amount of information in both time and frequency domains, the integers m and n need not necessarily need be particularly large. Even with direct addressing, as will be discussed in further detail below, there will be a variable computable time lag for signals from different plenirons within an array. Given the known address, though, these conduction-path time lags can be accounted for algorithmically.

It should be noted that reasonably sized, practical plenistells can be built and grouped, for example, with known gap distances between them. The gap distances can also be used in an algorithm to spatially, temporally, and chromatically "de-gap" or "re-group" an array of arrays. The device space allowed by these designed-in gaps allows for some pre-processing circuitry as well as wide regions where coded grouped signals can be transferred with wider and more conductive lines for example following an analog-to-digital converter (ADC) and then grouping bits in accordance with a defined protocol. If the precision of direct addressing is necessary for very large information sets there is no detriment to spacing plenistells in repeatable, wider arrays themselves, which then are also plenistells in their own right. A more common experience example of this is the use of multiple primary mirrors in a reflector telescope or many radio dishes together in a Very Large Array (VLA).

Based on the design data, from material system as well as other factors as set forth in Table 1 above, the pleniron outer extent size (diameter) would typically be in the micron to tens of microns range. Note that with very high quality semiconductors, as well as those with conducive dielectric functions and perhaps indirect band gaps (i.e., c-Si), the sizes of the individual devices could reasonably reach over 100 microns. This is mentioned here to provide an indicator, $$h + \frac{c}{t}\sin\theta$$

given the size range of conducting lines via lithography with contemporary technology, that sub-substrate layers or substrate backsides can provide space for a great many conducting lines which are suitably isolated to avoid electromagnetic "crosstalk". The plenirion size ranges, especially with the best semiconductor choices for high precision, are more than sufficient to allow conduction line layering to be a rather ordinary engineering problem.

The lag times and ensuing complexity associated with an indirect addressing scheme, such as those used in an erasable programmable read-only memory (EPROM) or Flash Memory array, can still allow decodable volumetric information from each individual pleniron in a plenistell to provide more information than any current device. Decoding, although potentially more complicated, can still provide vast amounts of information for most, if not all, of the embodiments described herein.

When accounting for conduction time differences in the matrix of lines, any Matrix-Addressed plenistell provides information from the individual plenirons capable of discerning distinct and unique time-separated events in 4 dimensions. True time-of-flight, intensity, chromaticity, polarization, and spatial variation information, for full 4-dimensional optical object reformation is available from this device. Contrast this capability, for reference, with a planar-style photodetector, array or otherwise, which has no real Z-axis variation and thus no capability to retain temporally spaced events simultaneous with their spatial counterparts.

The above described embodiment, for purposes of nomenclature, can be referred to henceforth as a "Matrixed" or "Addressed" type of plenistell. The two names, however, are not necessarily interchangeable. Being a "Matrixed" type of plenistell means that some method of electrically connecting each individual pleniron in such an array has been done. Typically, this will be a regular layout of conducting lines that are electrically insulated so that each individual pleniron has its own individually selectable detector circuit. This may or may not be done using the set of basis vectors referred to in the above discussion. Indeed, this might be the simplest way to provide individual addresses to each pleniron. "Matrixed" indicates a physical arrangement of electrical connection, while an addressing scheme does not have to follow a coordinate system or even the physical arrangement of conductors. It could be coded separately and independent of the physical layout through software manipulation. Indeed, an "Addressed" plenistell can even have layers of interconnects that have a third, fourth, or more, layers of conductors and vias, for selecting individual plenirons in laid-out regions stressed with more importance.

Figure 32:
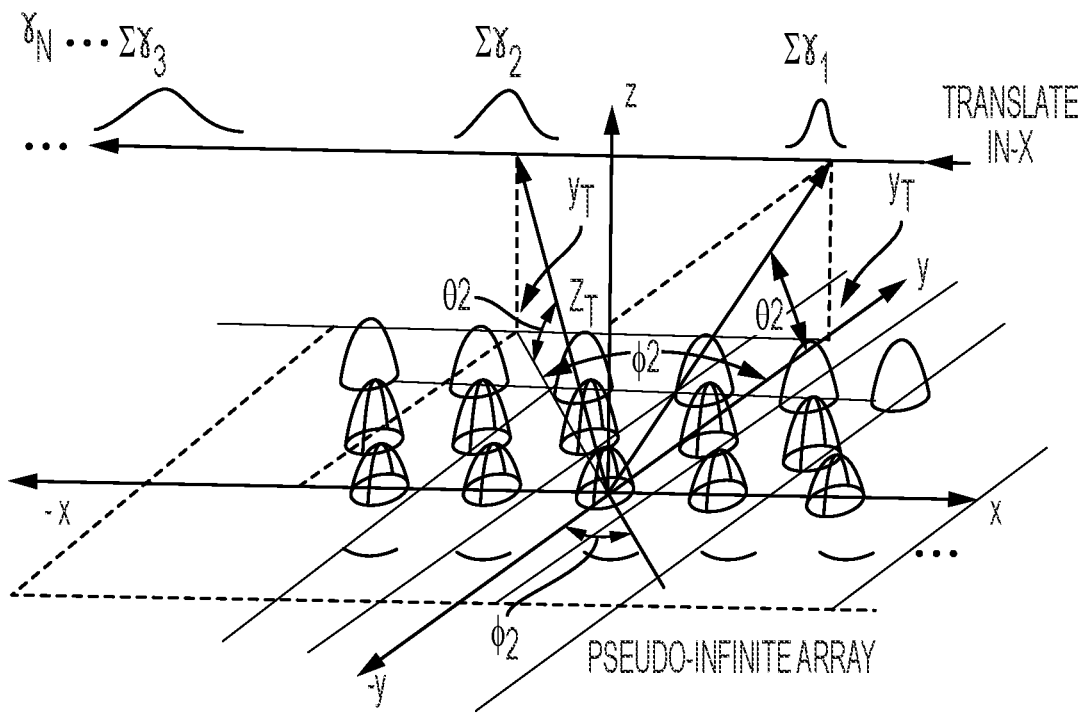
FIG. 32 is a diagram of a Gaussian, point, or plane wave source translating in either a line or more complex orbit relative to a plenistell detector array in accordance with one or more embodiments.

In another manner by which more information can be gleaned from a regularly spaced and organized pleniron array, or plenistell, standard methods of transferring electric potential and current can be used to rotate one or more around a chosen axis. It is noted that any combination of axes of rotation or combination of rotations and translations may be used as they may provide additional information from a specific detection setup or utilization. As a specific example, a single axis rotation at a constant angular velocity, with a regular period, can be used in conjunction with the periodicity of the regular plenistell basis vector set, to provide even more information, with fewer unknowns or more variables, in either a Block or Matrix-Addressed arrangement. For further example, as introduced in FIG. 32, a Gaussian, point, or plane wave source is translating in either a line or more complex "orbit" relative to a plenistell detector array (here, it is Matrix-Addressed). Because of real time comparison, on a pleniron level, between the changes to the time varying current at various addresses due to the inherent azimuthal/altitudinal structurally-based factors with those from an expected variation due to a 2*Pi periodicity from rotation, a spinning plenistell detector array ameliorates or negates unknowns from source distance and movement.

Because a rotating plenistell Matrix-Addressed array detector is creating an independent non-inertial reference frame that transcends Lorentz transformations, it is able to utilize all of the aspects above synergistically to even detect source accelerations or complex changes in movement relative to a plenistell axis. This detection ability is independent of additional capability to simultaneously detect time-based source "on/off" events or virtually any aspect of source or sources variation.

The plenistell, whether rotating, or otherwise, as well as Block or Matrix-Addressed, has inherent color, or chromaticity, detection ability that is independent of its spatially and temporally varying source detection. Referring back to Table 1 and the related discussion, we see that the geometry, including the layer thicknesses, for the appropriate degree of waveguiding and cavity resonation, as well as spacing and accompanying occlusion, are determined partially at the outset of design, by the selection of material system, i.e., the absorber semiconductor being polysilicon or Ga—As or CIGS, etc., due to its band gap, index of refraction, and extinction coefficient (which are all functions of wavelength over the range of absorption. These parts of the electronic structure of the material and its dielectric function determine a range of the physical parameters mentioned that will result in a set of optimal device detection characteristics. These contribute to one metric indicated herein. For this discussion the quantity in parentheses in the equation in this section can be referred to as the "Grand Ratio", and Eqn. 1 herein, which due to the inverse Sine function, only allows closer to optimal absorption at Grand Ratios (or GRs) that are <1. Any GR greater than 1, as determined by the physical layer and core measurements, produces an expression in the parentheses resulting in an angle, $\theta_{in}$, which can only have purely imaginary number solutions. Structures which optimally absorb the light within the range of the chosen semiconductor's electronic band gap range will have the GR<1 so that the angle solution, $\theta_{in}$, is a real-valued number. These relations between optimal absorption and the semiconductor, expressed in a simple relationship such as GR, applies to the discussion of not only broad range absorption but also unique detection of spectral information by a pleniron, and plenistell detector.

Figure 33:
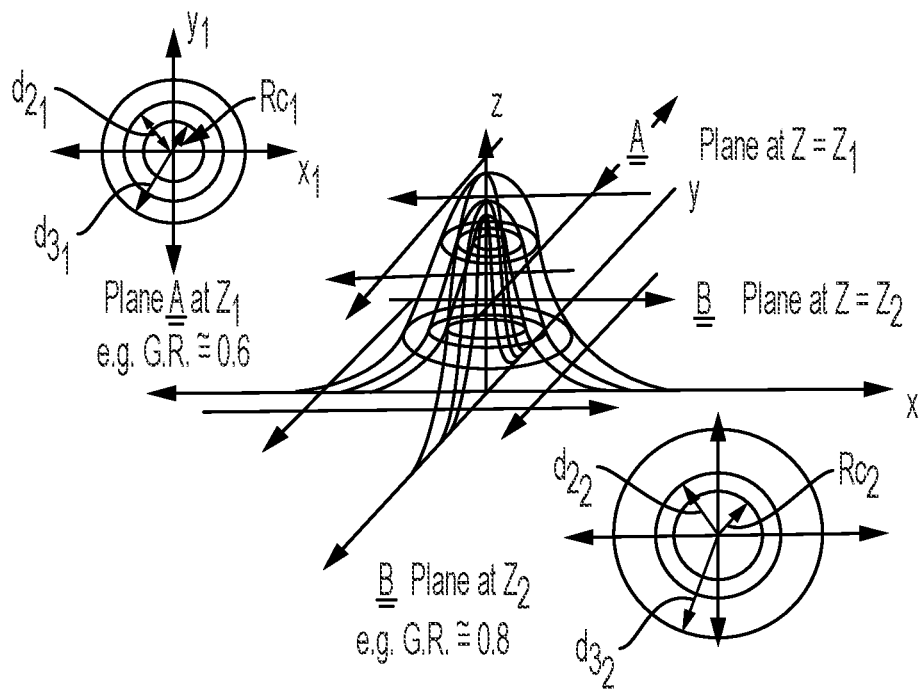
FIG. 33 is a diagram of a Gaussian-shaped pleniron created as a result of a topographical back contact with a conducive imprinting process in accordance with one or more embodiments.

It should be noted that the relatively simple metric of GR may also itself vary within a single pleniron since not only can one with a core have such that varies from spherical, and the accompanying layers are not conformal, but a pleniron made from underlying back-contact topology can also be made such that it varies from spherical and conformality. These variations in GR can be suitable when provide better values at different Z-direction heights in a pleniron. A Gaussian-shaped pleniron, for example created as a result of a topographical back contact with a conducive imprinting process, is shown in FIG. 33. Note that two separate arbitrary example cross sections are taken (A and B) where GR varies but remains solidly <1. These are taken at, again, arbitrary levels of z, such as $z=z_1$ and $z=z_2$. These A and B cross-sections are shown as insets with their corresponding standard parameters, such as $R_C$, $d_2$, and $d_3$.

The aforementioned electronic band gap of the chosen semiconductor (material system), is the distance in energy and momentum "space", following Fourier transforms, between the valence band, full of available electrons, and the conduction band, where the electrons must be elevated to contribute to conduction. In the chosen materials system, dopants, or controlled amounts of selected impurities, can be added to allow additional available electrons closer in energy space to the conduction region mentioned above. This electronic band gap, either intrinsic material, or with dopants, is the ultimate "arbiter" of the longest wavelength (least energetic) photon or more "reddish" color actually produces electrical current rather than heat. In some semiconductors the band gap energy translates into absorption ability well into the infrared range such as with crystalline Si.

One example mechanism by which a pleniron detects color is through its geometry, such as in the layer thicknesses, the core size and shape, and the ratios of the same. Note, however, that the GR of a given structure also depends on its refractive indices, which is the real part of the square root of the dielectric function, which varies by its dispersion relation across its useful electronic absorption range. The imaginary part of the square root of the complex, and spectrally varying, dielectric function is the extinction coefficient, k. This will determine the distance that a wave, as a function of wavelength, will travel in the semiconductor material once it is trapped by the optimized geometry. Since the pleniron structure, as outlined herein, allows the semiconductor, due to its higher real-valued refractive index, to waveguide light, and act as an annular cavity resonator, wavelengths of light with lower k values, typically according to the dispersion relation, longer, or more red regions of the spectrum, will travel further prior to absorption. Shorter wavelengths near the UV-range will absorb very quickly and may not waveguide at all, being absorbed before even reaching a reflective back surface of the annulus. Therefore, bluer areas of the spectrum can have far less angular dependence and will act upon either a pleniron alone, or especially upon a regularly spaced plenistell, more as an angled flat or planar surface. The lack of angular dependence in this range can be true for both azimuthal or altitudinal dependencies.

It should be noted that the lack of angular dependence for blue light is true for the structure and array under consideration in the discussion above. Although for said structure the lack of blue-range angular dependence, along with its unique electronic signature, aids in the color identification, a different structure, with different geometry and a requisite material system, optionally can accompany the above to obtain complex angular dependencies in the blue or ultraviolet range as well.

It would not only be the angular dependence, in multiple directions, and with polarization variation, that would identify the spectral range of incident light, but also electronic factors unique to that range. Regardless of the quality of a given semiconductor system, there will always be equivalent resistances in a detector circuit representing electron-hole recombination. When a photovoltaic device generates an electric current from photons, an exciton is created in the device's depletion region. For charge conservation reasons the exciton is a quasi-particle that represents during its lifetime both an electron and a hole. These are provided enough energy by the incident photon to escape the valence band, be accelerated oppositely each other by the depletion zone field, and eventually enter the front or back electrical contact. The incident photon energy, however, also determines the exciton's total "leftover" kinetic energy. Although a pleniron, as shown in FIG. 9, has the distinct advantage of a long optical path via the annular waveguide, but a short electrical path as determined by the conformal PN junction due to the layers and the resulting depletion zone electric field, shorter wavelength photons will have less likelihood of being recombined through collisions simply because they are energetic enough to exit the semiconductor quicker. This results in voltage changes across the junction due to equivalent parallel shunt resistance, as well as a series resistance as a direct voltage drop. These are easy to detect with angular variation in altitude given a lone pleniron, and both altitude and azimuth periodicities given a regular plenistell. All wavelengths in the dispersion relation range of the electronic band gap will have different series and shunt resistances and accompanying dependencies on all compound angles and periodicities due to the effects mentioned in the above discussion. The color-detection ability, through these factors, will be accentuated if a plenistell is Matrix-Addressed as well as outlined above.

In another embodiment, a Matrix-Addressed plenistell made up of plenirons which are intentionally made to be geometrically not optimized for light trapping and therefore have GRs of >1 can be considered. Furthermore, the junctions in these Matrix-Addressed plenirons can be engineered such that they are reversed photovoltaics, and therefore act as Light Emitting Diodes (LEDs). Since the GR is variable depending on underlying core or structured substrate variations from spherical as well as accompanying layer changes, a pleniron array of light emitters will vary widely from planar LED behavior. This is primarily because, even with lossy GR structures at or near above 1, the structure still waveguides and resonates, it just does so while "leaking" light in areas ideal for the electromagnetic mode and index-shifted wavelength at that exit "site".

As outlined herein, the pleniron, and especially its regularly arranged plenistell, is a true absorber of 3D electromagnetic information with an accompanying temporal component. Therefore, a specifically designed plenistell, from regularly spaced plenirons designed with GRs around and about 1, will be lossy waveguide resonators which similarly "leak" light into intended spectral ranges and specific angular directions. Such a plenistell, which is Matrix-Addressed as above, would be a true 3D EM image re-constructor. These effects can be dependent on the array being provided, via its Matrix-Addressing, an appropriately coded set of electrical signals that could excite the modes necessary for such 3D imagery. These can originate, in conceptions of the excitation, for example, as back contact signals that contain modes of frequency excitation using the core or back-contact structure as a form of antenna. The modal frequencies at the surface or interface of the back contact and the semiconductor instigate variable excitation along the annular PN junction. The light produced from the annular diode will then waveguide and resonate in a form similar to how it would have otherwise done as a light absorber. As indicated above, however, since this embodiment is for a release of full 3D imagery in a very wide solid angle over a properly configured plenistell, the layers and core are engineered specifically in accordance with Eqn. 1 in-[00042] herein to obtain GRs near and/or about 1. The physical layer thicknesses, core diameter, and accompanying material system can be designed in this case to "leak" light at a specifically engineered rate in the correct spectral ranges to allow the formation, from applicable code, of a full 3D image in the widest possible solid angle. Some of these concepts are illustrated in FIG. 34.

Figure 34:
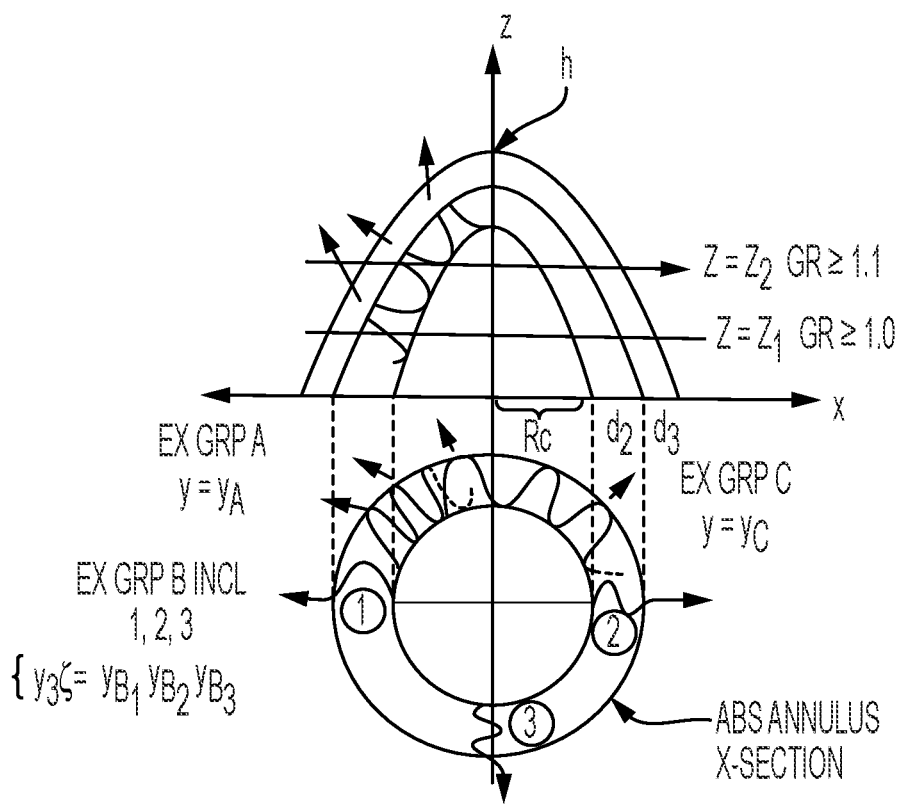
FIG. 34 is a diagram of a pleniron of an approximately spheroidal to inverted-parabolic outer shape in two separate cross-sections in accordance with one or more embodiments.

FIG. 34 shows a pleniron of an approximately spheroidal to inverted-parabolic outer shape in two separate cross-sections. Each of these cross-sections shows light leakage from separate types of modes. Here, the cross-section is viewed as at least partially cylindrical-to-hemispherical geometry that leads to Bessel function solutions radially, Hankel-variants azimuthally, and rough sinusoids axially, where the term "axial" is used very loosely. In each case the waveforms shown in example are indicative of their respective form of light "leakage". Note that in the upper cross section, shown in the x-z plane, the "axial" rough sinusoids are shown leaking with example "rays" coming out in various directions. Here, some arbitrary cross sections are taken to show that example GRs are at, about, or >1. Note that the typical geometrical methodology for measuring GR is provided in $R_C$, $d_2$, and $d_3$. This cross section is shown, in this same figure, transferred by projection to the x-y plane. Here there are three groups of example waves "leaking" from their modes. Group A is a high frequency example azimuthal wave approximated by leaky Hankel-variant functions. The "leaks" are shown as "random" rays from the transparent conductor outer surface. The frequency of the azimuthal wave in this example is $v=v_A$. Lower frequency, with $v=v_c$, are shown as part of Group C. These are, likewise, leaking EM from the TCO surface. Group B includes radial modes of increasing frequency with $v=v_1$, $v_2$, $v_3$ at the 3 lower quadrants of the cross-section. These, as mentioned, are modified leaky Bessel-type functions.

It should be noted that the degree to which a pleniron will leak light is a complicated function dependent on spectrum, geometry, electronic considerations, dielectric function, and more. As a general rule, however, the further that the GR of a cross-section is from being GR>1, the more, exponentially, is the rate at which light at all wavelengths will exit a given cross section of outer surface.

The current embodiment under discussion can leads to the plenistell detector, which is Matrix-Addressed, and is the subject of discussion herein to act as an "encoder" of the real and complete 3D image data necessary for the image creation ability of the "lossy" plenistell as discussed herein and with respect to FIG. 34. That is, the Matrix-Addressed plenistell, which could otherwise be used as either a general purpose detector of a wide range of data or as a specific detector for whatever custom use an end-user requires, would here, specifically, be utilized as a detector to build an image coding that could be stored, digitally or otherwise. Therefore, the plenistell that obtains the involved data has plenirons in a regular array that have GRs of <1, while the plenistell that projects, casts, or releases the coded data, in Matrix-Addressed form, will have plenirons that have GRs near or about 1. This concept is incompletely analogized by referring to the capturing plenistell as a "camera". The rationale for the incompleteness of the summary is that a camera's detection apparatus usually comprises a pixel array of which each is a planar device that lacks the volumetric capacity or Optical Volume and time-based capture of a plenistell. Hereafter, for simplicity, a plenistell with the aforementioned characteristics to be used for capturing full 3D image data for digital storage can be referred to as a "plenera".

Although in general the optical characteristics of the beginning basic design of a plenera are simplified in the GR key metric, the electronic characteristics are mostly characterized around the dielectric function, electronic band gap, and the electronic (exciton) mean-free path across the useful spectrum. As mentioned above in multiple sections, the selection of the material system, as per Table and related discussion, determines the range of light that is not only absorbable, but that range that optimally captures, waveguides, resonates, and converts the light into electronic signals (excitons). The dielectric function, as mentioned, contains the index of refraction, n, and the extinction coefficient, k, which together determine the range of light which requires and allows the useful path length in the annular absorber to allow the resonation and guiding of waves as previously shown. The other factors were sufficiently described herein.

It should be mentioned that image data captured and stored by a plenera, whether digitally or in some other form, can also be transmitted, in any means available in the current art, such that it can be decoded and projected, cast, released, or otherwise viewed by a "lossy" plenistell as previously described herein. To understand the ramifications of the "projection" capability of such a plenistell, hereafter, for this embodiment, referred to as a "plenicast", one can imagine what an arbitrary viewer, on the receiving end, would observe. If, for example, a plenera captures, obtains, and stores full 3D imagery of a person who, for this example, would be taking up a large part of the solid angle of receptivity of the plenera, the 3D image data would be shown by the "plenicast" in a similar 3D fashion across its engineered lossy solid angle of "projection". Therefore, an image recreated by the plenicast would not be limited to the solid angle subtended by the physical size of the plenicast such as from a screen or objective at a distance, but would appear, due to its coding of the 3D data, as the person in total from whatever angle from which the observer happens to be. In other words, if an observer, on the receiving end, happens to be viewing from directly behind the plenicast, they would see an image of the person from the front, along with any nearby background or "near-ground" 3D imagery such as a stool or other furniture, etc. Moving outwards from this location, albeit not obstructing or obscuring the plenicast, one would see more of the side of the person and accompany objects or "near-ground". It is clear that such movement will affect the quality of the 3D image, as it is likely that color and intensity would diminish in various angular ranges and with distance. Methodologies to rectify this problem might include transmitting a full 3D image of the person from a nearly coaxial plenera, but using one with altered imaging qualities, having been varied from the first by modification of the optical factors mentioned in the preceding sections.

The imagery example in the previous section must be extended with caveats and solutions, as required, by various end-users. For extended example, consider that the plenera capturing the person's 3D image has only limited optical data from the person's back side if they are facing the plenera, as well as diminishing information about far oblique sides. The image from an observer viewing from in front of the plenicast would be a rather bizarre view of the front of the person but only a frontal "shell". Likewise, from the side one would view only the frontal shell captured by the plenera in front. All of these issues can be solved by transmitting a combined signal from a set of pleneras positioned appropriately to capture the entire shell of the person and provide a full "solid" appearing "form". Appropriate software could rectify any decoding issues such that the image can be reconstructed by a several plenicasts in total.

The embodiments under discussion herein naturally lead to another embodiment of the present invention by either actively or passively rendering a part of a cast or "projected" image as transparent or invisible. Given that the discussion henceforth has been using pleneras and plenicasts, often in arrangements, the active methodology of invisibility will be discussed first. It should be noted that a subject being ultimately viewed, such as the person in the previous examples, would view the image capturing plenera as a completely "void-like" black field of whatever shape. This is due to its near complete angular and spectral light capturing ability which virtually nullifies any reflection. Given, however, the specifically engineered nature of the plenicast, a transmitted set of 3D image data could be altered on the sending and/or receiving end such that the person does not appear in the end image. Therefore, one side of an object could be covered in pleneras while the other side is strategically covered in plenicasts. The plenera side can digitally encode the 3D imagery such that all of the plenicasts on the opposite side are transmitted data to project 3D imagery from the back to the front. This would effectively make the object invisible in whatever wavelength range desired through manipulation of the material system and accompanying optical and electronic factors.

Another embodiment encompasses the passive invisibility mentioned above, but more generally. If one envisions a plenistell, with light capturing plenirons, as designed per the requirements herein, but with either transparent or semi-transparent bottoms or bases. This concept is further illustrated in FIG. 35. Here, the typical geometric considerations are shown for GR as well as some example rays that pass through the base of the pleniron absorber annulus (in the width of $d_2$) and refract into the lower refractive index material underneath (here acting as the substrate). In this embodiment it is most desirable to utilize a high index material as the annulus waveguiding material previously in place as the absorbing material layer and/or core. It would be sufficient to have a high index material that has a very high path length for all but the shortest wavelength in its electronic band gap range. An example would be crystalline silicon (c-Si) because of its dielectric function encompassing a fairly low extinction coefficient, k, for most of the visible spectrum. Depending on the sizes of the plenirons involved, most the waveguided light would resonate within the annulus but be, again, "leaked", albeit this time from the base or bottom. If these bases were coupled optically to either standard optical fibers (although this is difficult on the scale of the plenirons given their area number density) or into a flat dielectric waveguide, then the 3D information could be transmitted optically in its entirety and thus skipping the encoding and decoding steps provided in the active embodiments above. Note that the figure repeats some explanation of these refractive index requirements.

In the embodiment under discussion a plenistell that wholly captures light over virtually all wavelengths and angles (and thus is black when viewed from above), when coupled to a flat waveguide plate, or flexible waveguide "ribbon" or "sheet", would passively transmit the whole and complete 3D image information optically to a single or set of "lossy" plenistells in some other location. If the flat waveguide were flexible and turned around to the other side of an object, as shown in the example provided in FIG. 36, the "lossy" plenistell would project, cast, or release full 3D imagery on the other side of the object, thereby rendering it completely invisible. This invisibility can be achieved in whatever ranges of wavelengths desired by the designer when they are considering material sets, sizes, layer thicknesses, GRs, and all of the other considerations provided herein.

The plenistells mentioned in the foregoing paragraph, for capturing and recreating a full 3D image through the use of such with GRs varying from <1 on one side versus near and about 1 on the other, are not limited in this embodiment to the rendering of an object invisible. The ability to capture a full 3D image and recreate it in another location passively through the use of a flexible waveguide can also clearly be used for Head Up Displays (HUDs), as well as extremely thin and light optical coupling devices for displaying full 3D information on typical optical viewable surfaces. Examples of this would be to transmit or cast passively 3D imagery onto the inside of sunglasses, eyeglasses, visors, contact lenses, retinas, or almost any other conceivable optical surface.

Figure 35:
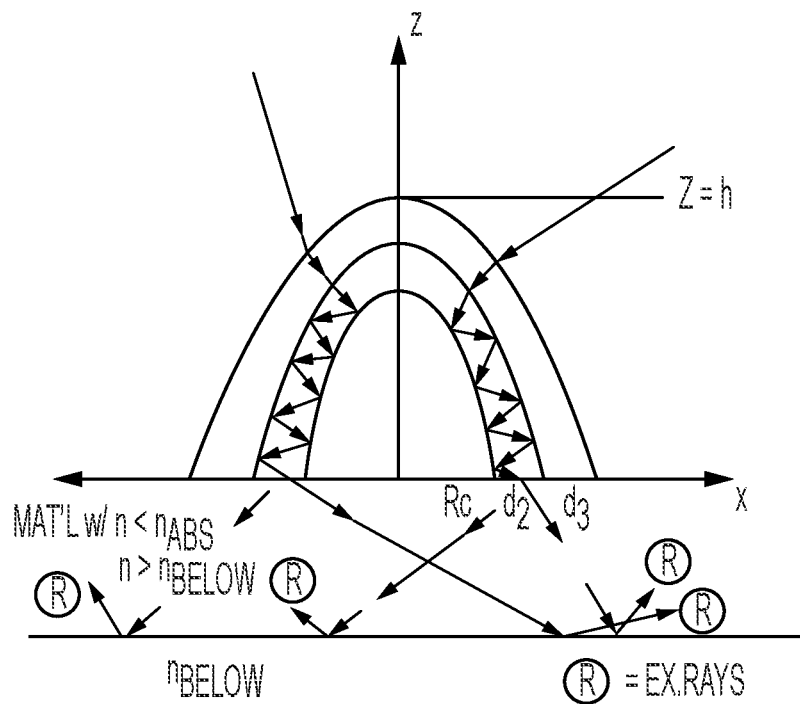
FIG. 35 is a diagram of a plenistell with light capturing plenirons with either transparent or semi-transparent bottoms or bases in accordance with one or more embodiments.
Figure 36:
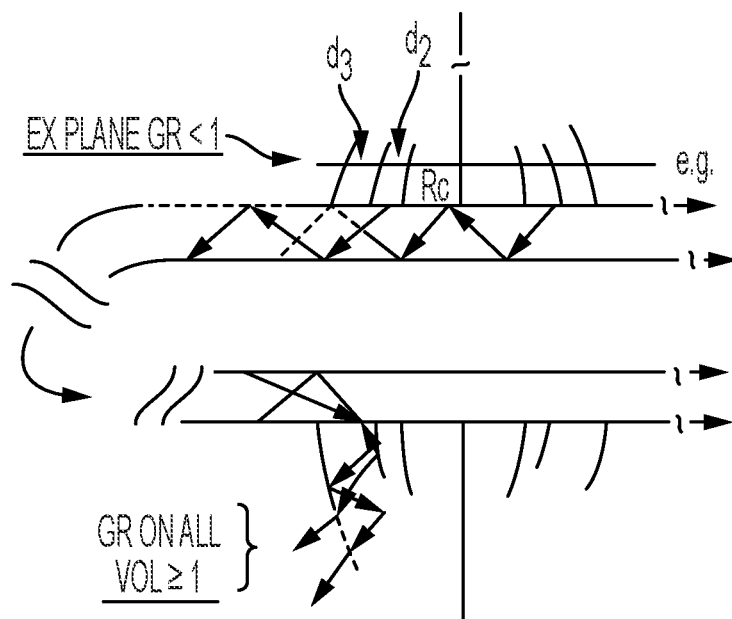
FIG. 36 is a diagram of flat waveguide that is flexible and turned around to the other side of an object in accordance with one or more embodiments.

In yet another embodiment of the current invention a plenistell could be used, in a manner similar to FIG. 35 and/or FIG. 36, to direct light collected from virtually all directions (as has been established in its entirety in this discourse) into an optical cavity. This could be for the purposes of optical memory storage or for optically pumping a lasing material such as a crystal, gas, or plasma.

Although the claimed subject matter has been described with a certain degree of particularity, it should be recognized that elements thereof may be altered by persons skilled in the art without departing from the spirit and/or scope of claimed subject matter. It is believed that the subject matter pertaining to a sensor comprising photovoltaic device and many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A sensor, comprising:
   a photovoltaic device, wherein the photovoltaic device comprises:
      a core having a shape that is at least partially spherical;
      an absorber disposed over the core and having a shape that is at least partially curved; and
      a transparent conductor disposed over the absorber and having a shape that is at least partially curved;
   wherein the transparent conductor has an index of refraction that is less than an index of refraction of the absorber such that the transparent conductor and the absorber function as a lens to refract impinging photons into the absorber;
   wherein an interface between the transparent conductor and the absorber has a smoothness defined such that a distance between peak to peak features on a surface of the transparent conductor at the interface is less than about one tenth of a wavelength of the impinging photons divided by the index of refraction of the transparent conductor; and
   wherein the absorber and the transparent conductor have indices of refraction and thicknesses selected to function as an annular waveguide such that the photons impinging into the absorber travel circumferentially in the absorber about a center of the core.

2. The sensor of claim 1, wherein the photovoltaic device is configured to output a signal responsive to the impinging photons that is representative of a direction, an intensity, and a wavelength of the impinging photons.

3. The sensor of claim 1, wherein the photovoltaic device has a grand ratio that is less than a value of 1.

4. The sensor of claim 1, wherein the photovoltaic device has a spheroidal shape, a partial spheroidal shape, or a partial solid oval shape.

5. The sensor of claim 1, wherein the photovoltaic device has a paraboloid shape or a partial ellipsoid shape.

6. The sensor of claim 1, wherein the photovoltaic device has a Gaussian shape.

7. A sensor array, comprising:
an array of photovoltaic devices, wherein one or more of the photovoltaic devices comprises:
a photovoltaic device, wherein the photovoltaic device comprises:
a core having a shape that is at least partially spherical;
an absorber disposed over the core and having a shape that is at least partially curved; and
a transparent conductor disposed over the absorber and having a shape that is at least partially curved;
wherein the transparent conductor has an index of refraction that is less than an index of refraction of the absorber such that the transparent conductor and the absorber function as a lens to refract impinging photons into the absorber;
wherein an interface between the transparent conductor and the absorber has a smoothness defined such that a distance between peak to peak features on a surface of the transparent conductor at the interface is less than about one tenth of a wavelength of the impinging photons divided by the index of refraction of the transparent conductor; and
wherein the absorber and the transparent conductor have indices of refraction and thicknesses selected to function as an annular waveguide such that the photons impinging into the absorber travel circumferentially in the absorber about a center of the core; and
a matrix of conductor lines coupled to the array of photovoltaic devices, wherein each of the photovoltaic devices provides a signal on a respective conductor line that is representative of a direction, an intensity, and a wavelength of the impinging photons impinging on a respective photovoltaic device.

8. The sensor array of claim 7, wherein one or more of the photovoltaic devices has a grand ratio that is less than a value of 1.

9. The sensor array of claim 7, wherein the signal provides by the array of photovoltaic devices comprises a three-dimensional (3D) image.

10. A display device, comprising:
an array of photovoltaic devices, wherein one or more of the photovoltaic devices comprises:
a photovoltaic device, wherein the photovoltaic device comprises:
a core having a shape that is at least partially spherical;
an absorber disposed over the core and having a shape that is at least partially curved; and
a transparent conductor disposed over the absorber and having a shape that is at least partially curved;
wherein the transparent conductor has an index of refraction that is less than an index of refraction of the absorber such that the transparent conductor and the absorber function as a lens to refract emitted photons from the absorber;
wherein an interface between the transparent conductor and the absorber has a smoothness defined such that a distance between peak to peak features on a surface of the transparent conductor at the interface is less than about one tenth of a wavelength of the emitted photons divided by the index of refraction of the transparent conductor; and
wherein the absorber and the transparent conductor have indices of refraction and thicknesses selected to function as an annular waveguide such that the photons generated from the absorber travel circumferentially in the absorber about a center of the core; and
a matrix of conductor lines coupled to the array of photovoltaic devices, wherein each of the photovoltaic devices in the array of photovoltaic devices emits photons responsive to a signal on a respective conductor line that is representative of a direction, an intensity, and a wavelength of the emitted photons emitted from a respective photovoltaic device.

11. The display device of claim 10, wherein one or more of the photovoltaic devices has a grand ratio that is greater than a value of 1.

12. The display device of claim 10, wherein the photons emitted by the array of photovoltaic devices comprises a three-dimensional (3D) image.

* * * * *